United States Patent

Kimura

[11] Patent Number: 5,862,586
[45] Date of Patent: Jan. 26, 1999

[54] METHOD AND APPARATUS FOR MOUNTING COMPONENTS TO SHORTEN TACT TIME

[75] Inventor: Akira Kimura, Tokyo, Japan

[73] Assignee: Sony Corporation, Japan

[21] Appl. No.: 766,770

[22] Filed: Dec. 13, 1996

[30] Foreign Application Priority Data

Dec. 26, 1995 [JP] Japan ..................................... 7-351389

[51] Int. Cl.$^6$ .............................. H05K 3/30; B23P 19/00
[52] U.S. Cl. ............................ 29/832; 29/564; 29/564.1; 29/740
[58] Field of Search .............................. 29/740, 741, 840, 29/832, 564, 564.1

[56] References Cited

U.S. PATENT DOCUMENTS

| | | | |
|---|---|---|---|
| 4,631,816 | 12/1986 | Fujita | 29/740 |
| 4,881,319 | 11/1989 | Yagi et al. | 29/740 X |
| 4,951,388 | 8/1990 | Eguchi et al. | 29/740 X |
| 5,040,291 | 8/1991 | Janisiewicz et al. | 29/740 X |
| 5,377,405 | 1/1995 | Sakurai et al. | 29/740 X |
| 5,452,509 | 9/1995 | Suzuki et al. | 29/740 |
| 5,566,447 | 10/1996 | Sakurai | 29/740 X |

FOREIGN PATENT DOCUMENTS 5-267896  10/1993  Japan ..................................... 29/740

Primary Examiner—Carl J. Arbes
Attorney, Agent, or Firm—Ronald P. Kananen

[57] ABSTRACT

In a components mounting apparatus, so-called mounting tact time per a single electronic component is shortened. The components mounting apparatus in which a large number of electronic components are transported from a components supplying region where a plurality of components supplying apparatuses are arranged with the large number of electronic components stored thereinto to a components mounting region in which a board is arranged with the electronic components mounted on preselected mounting positions of the board thereon is comprised of: components gripper for individually gripping the electronic components; and a tool head on which a plurality of components gripper are mounted and which is movably provided between the components supplying region and the components mounting region. The components gripper is supported movably in the upward and downward direction with respect to the tool head, and moves up and down for gripping or releasing the electronic components when positioned to a preselected position in the tool head. The tool head is provided rotatably in the forward and reverse directions so that the tool head is rotated for selecting the components gripper and positioning the selected components gripper to a preselected position.

12 Claims, 11 Drawing Sheets

S---components supplying region
M---components mounting region
1---components mounting apparatus
7---tool head
8---absorbing nozzle (components gripping means)
9---board
13---chip components (electronic components)
14---components supplying apparatus S···components supplying region
M···components mounting region
1···components mounting apparatus
7···tool head
8···absorbing nozzle (components gripping means)
9···board
14···components supplying apparatus S···components supplying region
M···components mounting region
1···components mounting apparatus
7···tool head
8···absorbing nozzle (components gripping means)
9···board
13···chip components (electronic components)
14···components supplying apparatus S⋯components supplying region
M⋯components mounting region
1⋯components mounting apparatus
7⋯tool head
8⋯absorbing nozzle (components gripping means)
9⋯board
14⋯components supplying apparatus 1···components mounting apparatus
7···tool head
8···absorbing nozzle S···components supplying region
M···components mounting region
9···board

METHOD AND APPARATUS FOR MOUNTING COMPONENTS TO SHORTEN TACT TIME

BACKGROUND OF THE INVENTION

1. Field of the Invention

The present invention generally relates to a method and an apparatus for mounting electronic components on a printed circuit board. More specifically, the present invention is directed to a technique capable of shortening so-called "mounting tact time" per one electronic component.

2. Description of the Related Art

Electronic components are mounted on printed circuit boards by automatic machines, for instance, components mounting apparatuses for using so-termed "mounting type electronic components". One of these automatic components mounting apparatuses is described in, e.g., Japanese Laid-open Patent Application No. 5-192824.

This components mounting apparatus is equipped with the turn table 13 and a plurality of mounting heads 15. The turn table 13 is hung on the supporting base 28 and is intermittently and rotatably provided in such a manner that the rotation shaft is extended along the vertical direction. These mounting heads 15 are arranged on the outer peripheral portion of this turn table 13 along the peripheral direction. One of positions where the mounting head 15 is stopped corresponds to the absorption station. At this absorption station, the components supplying apparatus 8 for supplying the chip components 5 is provided. On the other hand, another position located opposite to the turn table 13 of the absorption station corresponds to the mounting station. The board 6 movably supported along the X-Y direction is mounted on the lower portion of the mounting head 15 positioned at this mounting station.

A plurality of components supplying apparatuses 8 are arranged within a preselected range containing a portion of the position corresponding to the absorption station of the turn table 13. A designated components supplying apparatus 8 is transported to the position corresponding to the absorption station.

One mounting head 15 absorbs the chip component 5 supplied from the components supplying apparatus 8 in the absorption station. Then, the turn table 13 is intermittently rotated by one pitch. The next mounting head 15 is located at the absorption station, and then absorbs the chip component 5 similar to the above-described mounting head 15. Then, the turn table 13 is again intermittently rotated. Thus, the chip component 5 is absorbed by the mounting head 15 located at the absorption station in this manner.

Then, the mounting head 15 which has absorbed the chip component 5 is transported to the mounting station by rotating the turn table 13. At this mounting station, the mounting head 15 descends to mount the chip component 5 on the board 6.

Prior to mounting of the chip component 5, the board 6 is moved by the X-Y table 3, so that this designated component mounting place is positioned in correspondence with the mounting station.

The above-described absorbing and mounting operations of the chip components 5 are carried out in accordance with a previously designated sequence. In other words, one components supplying apparatus designated in accordance with the above-described sequence among the components supplying apparatuses 8 is transported to the position corresponding to the absorption station. After this designated chip component 5 has been absorbed by the mounting head 15, this chip component 5 is transported by the turn table 13 to the mounting station. At the same time, the board 6 is transported by the X-Y table 3, and thus a predetermined position where this chip component 5 is mounted corresponds to the mounting station, so that the mounting head 15 descends so as to mount the designated chip component 5 on the board 6.

To shorten the components mounting tact time in such a conventional components mounting apparatus, while the respective mechanical elements (components supplying apparatuses, turn table, mounting head, etc.) are operated at high speed, the arranging sequence of these components supplying apparatuses 8 and also the transporting sequence (transporting sequence to mounting position) of the X-Y table 3 must be optimized. The cooperation between the respective mechanical elements and other mechanical elements must be optimized to thereby shorten the work waiting time. As a consequence, the absorbing sequence and/or the mounting sequence of the components by the mounting head 15 must be effectively set.

For instance, the transporting sequence of the X-Y table 3 is determined in this order, namely such a predetermined mounting position located near the edge of preselected mounting positions on the board 6. This way causes the transporting sequence to be optimized only if the transport time of the X-Y table 3 is considered. However, when this transporting sequence is designed on the basis of the arranging order of the components supplying apparatuses 8, since there are many possibilities that a plurality of same sorts of components are mounted on the board 6, the components supplying apparatuses 8 must be transported in the reciprocation motion every time the same sort of components are mounted. Therefore, the above-described transporting sequence of the X-Y table 3 is not always the optimum transporting sequence for the components supplying apparatus 8. Accordingly, the overall mounting tact time could not be shortened.

Also, in such a case that the components supplying apparatuses 8 are arranged in accordance with a certain sequence, for example, in a higher use-frequency order, and the transporting sequence of the X-Y table 3 is designed based on this arranging sequence, this transporting sequence of the X-Y table 3 does not always correspond to the optimum transporting sequence with respect to the X-Y table (3). In other words, this designed transporting sequence is not substantially equal to the optimum transporting sequence. As a result, there are many problems that when such a design is made on the basis of any one of the arranging sequence of the components supplying apparatuses 8 and the transporting sequence of the X-Y table 3, the other sequence would become unsuitable. It is practically difficult to determine either the optimum sequences or the sequences close to these optimum sequences for both cases.

This is caused because the transportation of the components as the operation switches between absorbing of the components and mounting the components is performed by rotating the turn table 13 along one direction, and thus such a fact that the degree of freedom in designing of these sequences is low.

Eventually, since the transportation of the components as the operations switches between absorbing of the components and mounting of the components is carried out by rotating the turn table 13 along one direction, there are limitations in designing and optimizing the arranging sequence and the transporting sequence. Accordingly, the components mounting tact time could not be shortened.

SUMMARY OF THE INVENTION

The present invention has been made to solve the above-described problems, and therefore, has an object to provide a components mounting method which is featured by that a plurality of electronic components are individually gripped by a plurality of gripping means in a components supplying region; and after these gripping means are transported to the components mounting region, each of said gripped electronic components is mounted on a predetermined mounting position thereof.

As a consequence, in accordance with the components mounting method of the present invention, the frequency of transportation between the components supply region and the components mounting region can be reduced, and the mounting tact time per single electronic component can be shortened.

A components mounting method of the present invention is featured by comprising the steps of:

subdividing at least one of the components supplying region and the components mounting region into a plurality of sections; and mounting the electronic components in a entire region of the mounting region by repeating one of the steps of:

gripping the electronic components by a plurality of the gripping means in one of the subdivided sections of the components supplying region and mounting the electronic components in the components mounting region and then gripping the electronic components by a plurality of the gripping means in another subdivided section of the components supplying region and mounting the electronic components in the components mounting region, gripping the electronic components by a plurality of the gripping means in the components supplying region and mounting the electronic components in one of the subdivided sections of the components mounting region and then gripping the electronic components by a plurality of the gripping means in the components supplying region again and mounting the electronic components in another subdivided section of the components mounting region; and gripping the electronic components by a plurality of the gripping means in one of the subdivided sections of the components supplying region and mounting the electronic components in one of subdivided section of the components mounting region and then gripping the electronic components by a plurality of the gripping means in another subdivided section of said components supplying region and mounting the electronic components in another subdivided section of the components mounting region.

As a consequence, the components supplying region and/or the components mounting region properly subdivided into a plurality of sections, can reduce the transport distance of the components gripping means while gripping and/or mounting the electronic components in the components supplying region and/or the components mounting region. The mounting tact time per single electronic component can therefore be further shortened.

A components mounting method is further featured by that the components supplying region is subdivided into two groups of subdivided sections arranged on both sides of the components mounting region in a direction identical to a direction along which the subdivided sections of the components mounting region are disposed, and the components mounting method comprises steps of:

gripping individually a plurality of the electronic components in one of the subdivided sections of said components supplying region by a plurality of the components gripping means;

transporting a plurality of the components gripping means to one of the subdivided sections of the components mounting region;

mounting each of the electronic components on a predetermined mounting position;

transporting a plurality of the components gripping means to another subdivided sections of the components supplying region;

gripping a plurality of the electronic components again in another subdivided sections of the components supplying region by a plurality of the components gripping means;

transporting a plurality of the components gripping means to another subdivided sections of the components mounting region;

mounting each of the electronic components on a predetermined mounting position;

repeating above steps until the electronic components are mounted in the entire region of the mounting region.

As a consequence, the subdivided groups of the components supplying region arranged on both sides of the components mounting region can increase the degree of freedom in designing the gripping sequence as well as the mounting sequence of these electronic components. Also, these sequences can be optimized.

Moreover, a components mounting method of the present invention is featured by that the electronic components are mounted from such a predetermined mounting position located closest to the components supplying apparatus where previous final gripping of the electronic components has been performed by the components gripping means among the components supplying apparatuses in the subdivided sections of the components supplying region.

As a consequence, the transport distance between the components supplying region and the components mounting region can be shortened. The mounting tact time per single electronic component can be further shortened.

A components mounting method of the present invention is further featured by that the electronic components are mounted in the components mounting region at a predetermined mounting position located closest to such a components supplying apparatus where the next first gripping of the electronic component is to be performed in the components supplying region to which the components gripping means are to be subsequently transported is designated as a final predetermined mounting position within the components mounting region among the predetermined mounting positions in the components mounting region.

As a consequence, the transport distance between the components supplying region and the components mounting region can be further reduced and the mounting time per single electronic component can be further shortened.

In addition, a components mounting apparatus of the present invention is featured by comprising: components gripping means for individually gripping the electronic components; and a tool head on which a plurality of the components gripping means are mounted, and which is movably provided between the components supplying region and the components mounting region; wherein the components gripping means is supported movably in the upward and downward direction with respect to the tool head, and moves up and down for gripping and releasing the electronic components when positioned to a preselected position in the tool head;

the tool head is provided rotatably in the forward and reverse directions so that the tool head is rotated for selecting the components gripping means and positioning the selected components gripping means to a preselected position.

As a consequence, the electronic components can be gripped by a plurality of components gripping means within the components supplying means in a random sequential order. Also, the electronic components can be mounted by a plurality of components gripping means in the components mounting means in a random sequential order. Accordingly, the gripping and mounting sequences of the electronic components can be set freely. It is possible to provide such a components mounting apparatus not restricted to these gripping and mounting sequences. The mounting tact time per single electronic component can be further shortened.

The components mounting apparatus of the present invention may be applied to a surface mounting apparatus for mounting chip type electronic components (will be referred to as "chip components" hereinafter).

The components mounting apparatus is featured by that the components gripping means can be a means for absorbing the electronic component by using negative pressure.

As a consequence, in accordance with the components mounting apparatus of the present invention, the electronic components can be gripped and mounted in higher speed. The mounting tact time per single electronic component can be further shortened.

BRIEF DESCRIPTION OF THE DRAWINGS

For a better understanding of the present invention, reference may be made to the accompanying drawings, in which.

DETAILED DESCRIPTION OF THE PREFERRED EMBODIMENTS

Referring now to drawings, a description will be made of various preferred embodiments of components mounting methods and components mounting apparatus in detail.

FIRST COMPONENTS MOUNTING APPARATUS

FIG. 1 to FIG. 4 schematically represents a components mounting apparatus according to a first preferred embodiment of the present invention.

First, a components mounting apparatus 1 according to the present invention will now be explained. The components mounting apparatus 1 is provided with regions for absorbing chip components on both sides of a region for mounting the chip components on a board.

Figure 1:
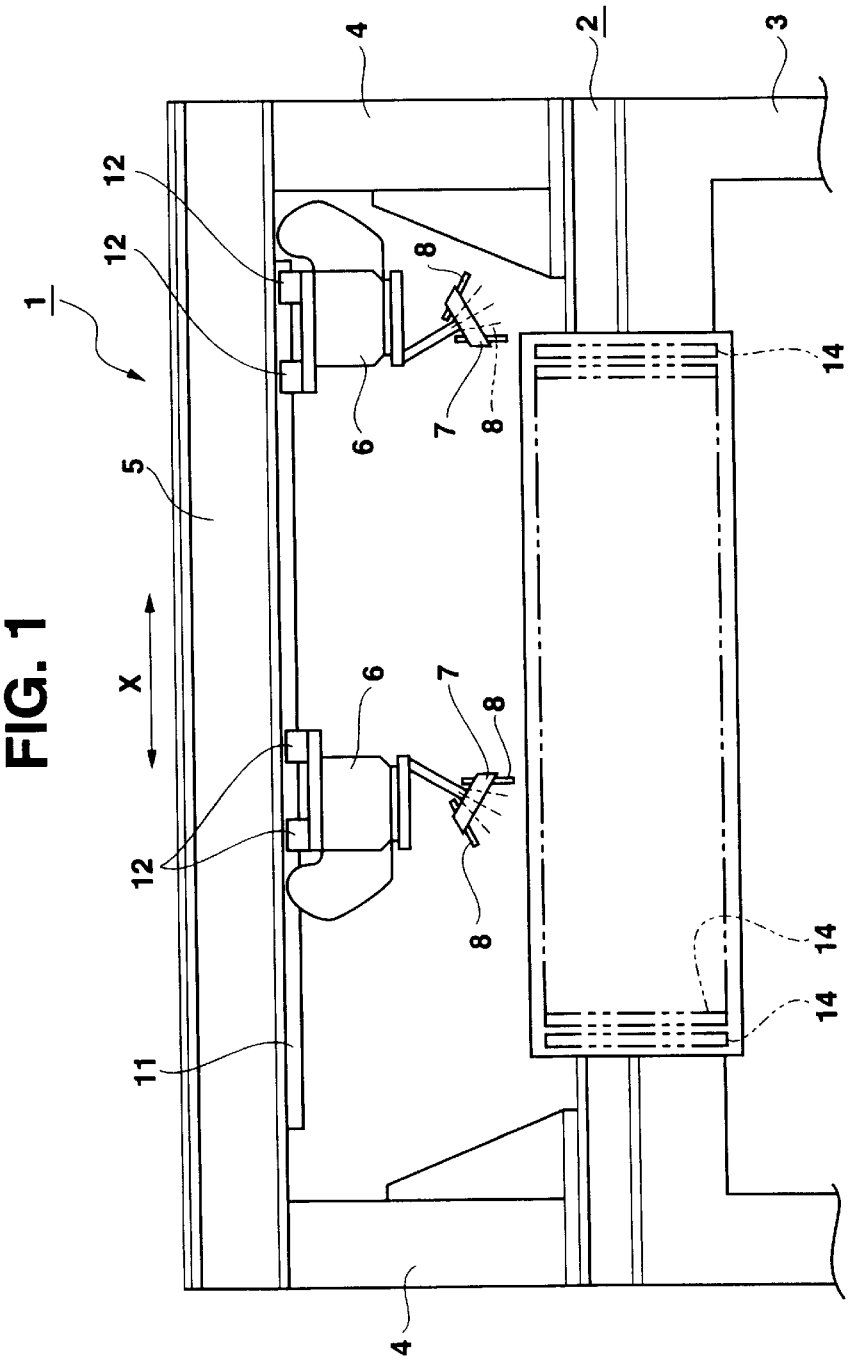
FIG. 1 schematically indicates a side view of an entire components mounting apparatus according to an embodiment of the present invention.
Figure 2:
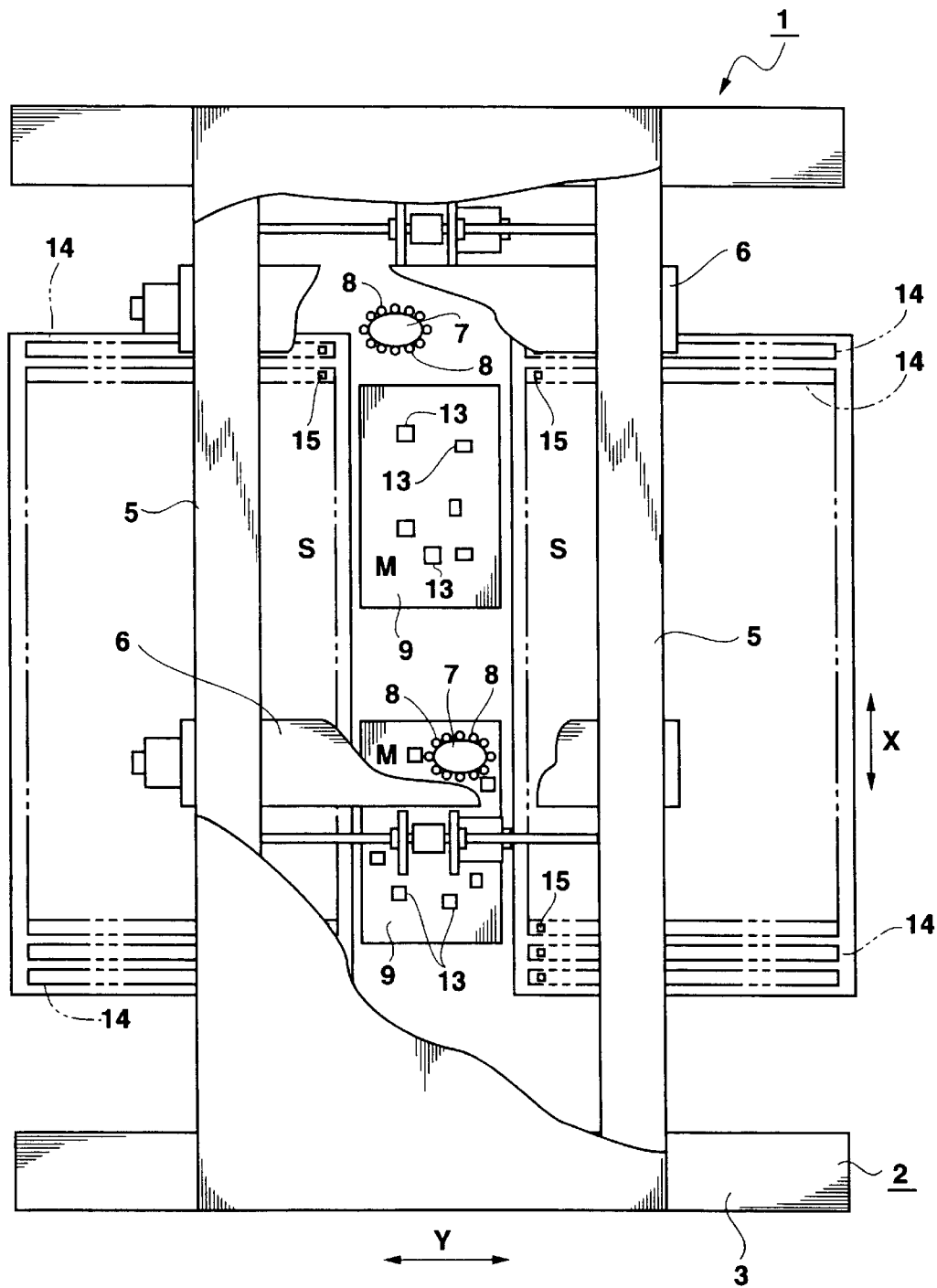
FIG. 2 schematically shows a plan view of the components mounting apparatus of FIG. 1.
Figure 3:
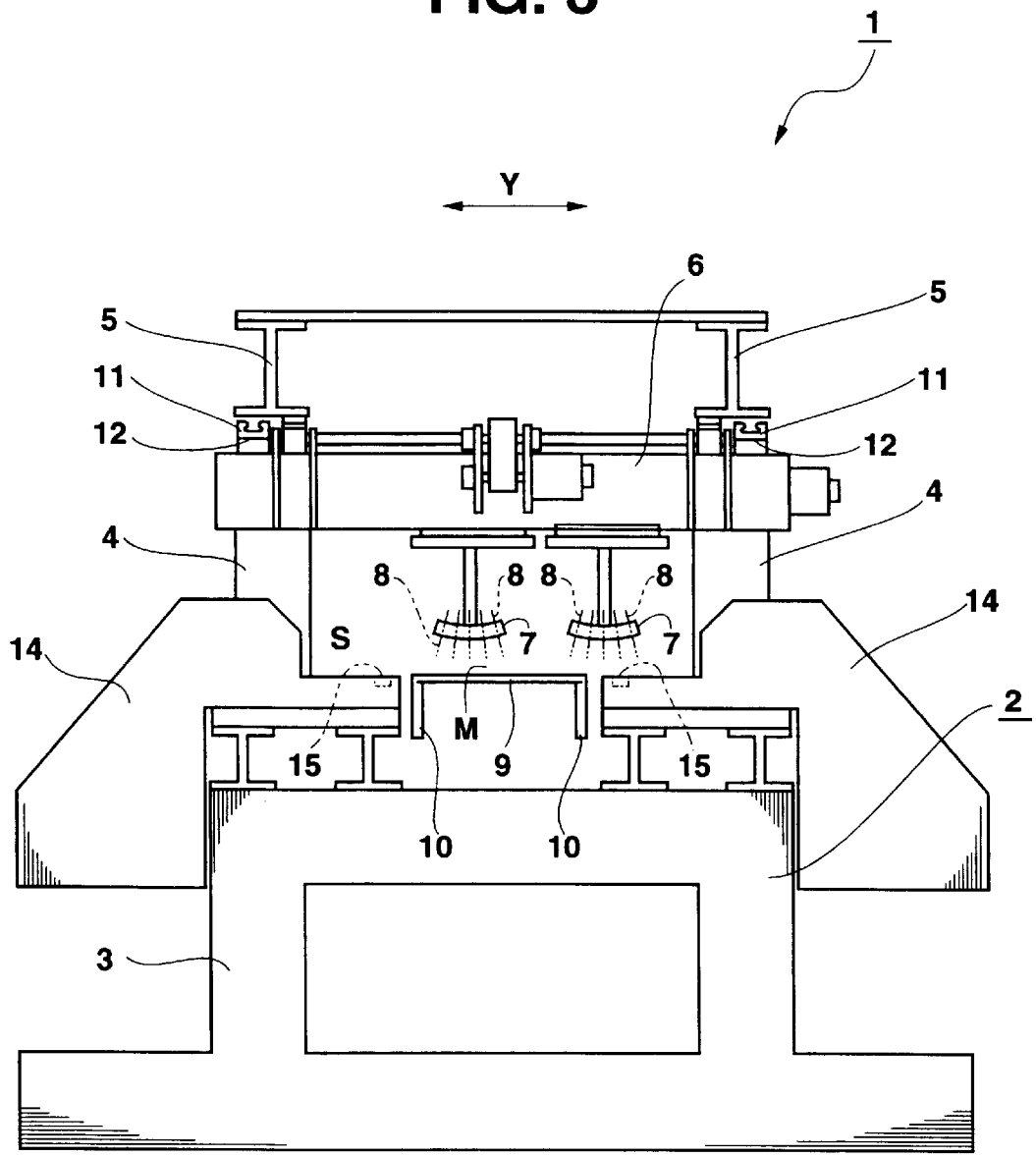
FIG. 3 schematically represents a front view of the components mounting apparatus of FIG. 1.
Figure 4:
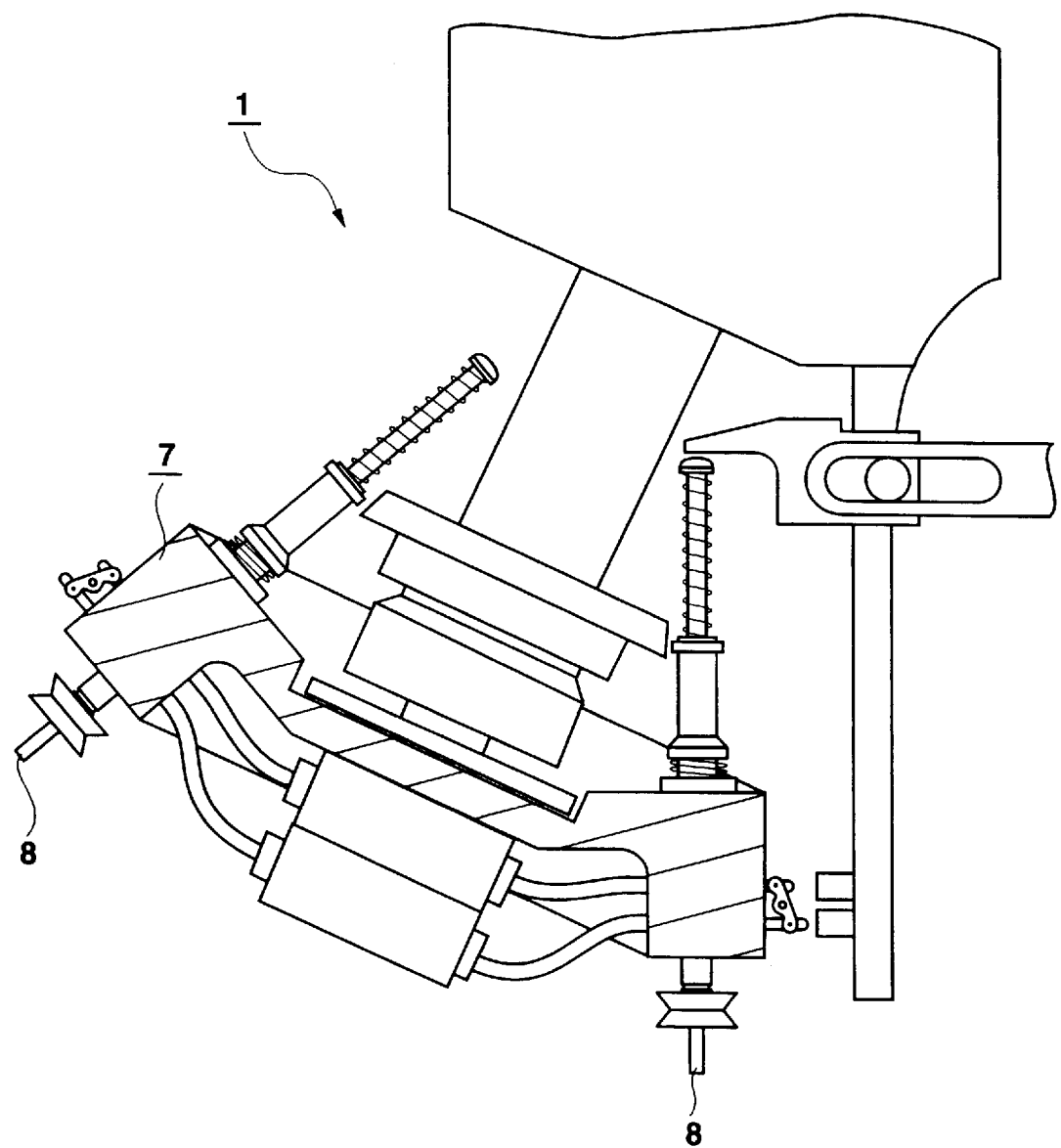
FIG. 4 is a side view for schematically showing a tool head of the components mounting apparatus in an enlarging form.

The components mounting apparatus 1 is arranged by employing a base unit 2, a base station 3 for supporting this base unit 2, and four sets of pillars 4, - - - , 4 stood at positions of right and left edges of both edge portions of this base station 3 along a front/rear direction, as viewed in FIG. 1. This components mounting apparatus 1 is further constructed of bridges 5 and 5 supported by the two sets of pillars 4 and 4 separated from each other along the front/rear direction and supported between the upper ends of the pillars 4 and 4 along a longitudinal direction of the base station 3; two sets of head mounting columns 6 and 6 hung between these bridges 5 and 5; a tool head 7 hung on each of the head mounting columns 6; and a plurality of absorbing nozzles 8, - - - , 8 arranged on this tool head 7. It should be noted that a direction indicated by an arrow shown in FIG. 1 or FIG. 2 is expressed as either a "front/rear direction" or an "arrow X-direction", whereas a direction indicated by an arrow Y is expressed as either a "right/left direction" or an "arrow Y-direction". This direction definition is similarly applied to the below-mentioned descriptions.

A central region of an upper surface of the base unit 2 along the right/left direction is used as a work arranging unit on which a work such as a board 9 is arranged. A fixing means 10 for fixing the board 9 is arranged on this work arranging unit so as to position the board 9. Also, two sheets of boards 9 are arranged on the work arranging unit in such a manner that these boards 9 and 9 are separated from each other along the front/rear direction.

Guide rails 11 and 11 are fixed on the lower surfaces of the above-explained bridges 5 and 5 in such a manner that these guide rails 11 and 11 are extended along the arrow X-direction. Guided members 12, - - - , 12, which are fixed on the upper surfaces of the both edge portions of the head mounting column 6, are engaged with the guide rails 11 and 11 in a slidable manner. As a result, the head mounting column 6 is slidably supported by the bridges 9 and 9 along the arrow X-direction. It should also be noted that drive means (not shown) are separately provided between the bridges 5 and 5, so that the head mounting columns 6 and 6 may be separately self-driven with respect to the bridges 5 and 5.

The tool heads 7 and 7 are separately provided on the head mounting columns 6 and 6 in such a manner that these tool heads 7 and 7 are hung thereon, and are slidably supported along the arrow Y-direction with respect to the head mounting columns 6. It should also be noted that the tool heads 7 and 7 are transported along the arrow Y-direction by rotating ball screws provided within the head mounting columns 6 and 6.

As a result, the tool heads 7 and 7 can be separately and freely transported along the X and Y directions by the transport of the head mounting columns 6 and 6 along the arrow X direction with respect to the bridges 5 and 5, and by the transport of the tool heads 7 and 7 along the arrow Y direction with respect to the head mounting columns 6 and 6.

Rotation shafts of the tool heads 7 and 7 are provided in such a manner that these rotation shafts are inclined respectively with respect to the vertical direction in such a way that the lower end of the front-sided tool head 7 is energized toward the front direction, whereas the lower end of the rear-sided tool head 7 is energized toward the rear direction (see FIG. 1), and furthermore, these tool heads 7 and 7 can be freely rotated in the normal/reverse directions.

20 sets of absorbing nozzles 8, - - - , 8 are arranged on the tool head 7 at equal intervals in an equiinterval at an outer peripheral portion thereof along the peripheral direction. Central axes of these absorbing nozzles 8, - - - , 8 are mounted on the rotation shaft of the tool head 7 at with having inclination angles with respect to this rotation shaft. This inclination angle is determined such that the upper ends of the respective absorbing nozzles 8, - - - ,8 approach the rotation shaft of the tool head 7. As a whole structure, these absorbing nozzles 8, - - - , 8 are arranged in a conically extending manner with respect to the tool head 7.

The absorbing nozzles 8, - - - , 8 are movably supported along the axial center directions thereof with respect to the tool head 7. When the absorbing nozzle 8 is located at an operation position (to be described later), this absorbing nozzle 8 is depressed by a depression means (not shown) from the upper direction to thereby descend.

Among these absorbing nozzles 8, - - - , 8, the axial center of the absorbing nozzle located at the rear end of the front-sided tool head 7 is directed to the vertical direction, and the axial center of the absorbing nozzle positioned at the front end of the rear-sided tool head 7 is directed to the vertical direction. This rear end position and front end position correspond to the above-described operation position, respectively. Then, chip components 13, - - - , 13 may be absorbed and/or released by the absorbing nozzles 8, - - - , 8 which are located at the operation positions and are directed to the vertical direction.

As to the chip components 13, - - - , 13 mounted on one sheet of board 9, there are, for example 120 sorts. These different sorts of chip components 13, - - - , 13 cannot be absorbed and mounted by using one type of absorbing nozzle 8. For instance, in such a case that there are 120 sorts of chip components 13, - - - , 13, for example, 5 types of absorbing nozzles 8, - - - , 8 are prepared. Then, 5 types of absorbing nozzles 8, - - - , 8 are arranged in such a set that, for instance, 9 pieces of first type of absorbing nozzles are prepared, 5 pieces of second type of absorbing nozzles are prepared, 3 pieces of third type of absorbing nozzles are prepared, 2 pieces of fourth type of absorbing nozzles are prepared, namely, the quantities of these absorbing nozzles are selected, depending upon use frequencies thereof.

It should be noted that the respective absorbing nozzles 8, - - - , 8 are connected to air compressors (not shown in detail), and a tip portion of the absorbing nozzle 8 located at the operation position is switched to either negative pressure or positive pressure at a predetermined timing. As a consequence, at this tip portion, the chip component 13 is absorbed, or released.

There is a region where the chip components 13, - - - , 13 are mounted on the boards 9 and 9 positioned and held by the fixing means 10 and 10, and such a region will be referred to as a "components mounting region M" hereinafter.

Also, 60 sets of components supplying apparatuses 14, - - - , 14 are arranged on both right and left sides of the components mounting region M. A large number of same sorts of chip components 13, - - - , 13 are stored in the respective components supplying apparatuses, 14, - - - , 14, and are supplied to the absorbing nozzles 8, - - - , 8 in response to requirements. It should be understood that this embodiment has described that the components supplying apparatuses 14, - - - , 14 are arranged on both the right and left sides of the component mounting region M. However, the present invention is not limited thereto, but may be also applied to such a case that the components supplying apparatuses 14, - - - , 14 are arranged only one side of the right/left sides of the components mounting region M.

The different sorts of chip components 13, - - - , 13 are stored into the corresponding components supplying apparatuses 14, - - - , 14 with respect of the sorts of the components supplying apparatuses 14, - - - , 14. Depending upon the sort of chip component 13 mounted on the position of the board 9, the absorbing nozzle 8 and the components supplying apparatus 14 are selected, and then this chip component 13 is absorbed.

Components supplying ports 15, - - - , 15 of the respective components supplying apparatuses 14, - - - , 14 are arranged on both the right and left sides of the fixing means 10 in parallel thereto. The chip components 13, 13 positioned to these components supplying ports 15, 15 are absorbed by the absorbing nozzles 8, - - - , 8. As a consequence, the region where a large number of components supplying ports 15, - - - , 15 corresponds to a region where the chip components 13, - - - , 13 are absorbed, which will be referred to as a "components supplying region S" hereinafter.

Then, the tool head 7 is designed in such a manner that the absorbing nozzles 8 and 8 are moved within a range of such a region for connecting the above-described components supplying region S and components mounting region M, and these absorbing nozzles are approached to the operation position thereof.

A description will now be made of the components mounting method according to the present invention, assuming now that a target mounting speed of the above-described components mounting apparatus 1 is set to, e.g., 0.2 second/chip. This mounting speed is defined by so-called "mounting tact time". In other words, this mounting tact time is a 1 cycle time period during which the chip component 13 is absorbed in the components supplying region S by the absorbing nozzles 8 and is transported to the components mounting region M, the absorbed chip component 13 is mounted on the board 9, and the absorbing nozzle 8 is returned to the components supplying region S. It should be noted that since the above-described components mounting apparatus 1 is equipped with the two tool heads 7 and 7, the chip components 13, --, 13 can be mounted on two sets of boards 9 and 9 at the same time. Accordingly, the target mounting tact time is one of these tool heads 7 and 7 is 0.4 seconds/chip.

In the following embodiment, such an assumption is made that the dimension of the board 9 is defined by 250 mm ×400 mm, and 120 types of chip components 13, - - - , 13 are mounted.

Assuming now that an interval between the adjoining components supplying ports 15 and 15 of the adjoining components supply apparatuses 14 and 14 is selected to be 20 mm, a length of the components supplying regions S and S located on both the right and left sides thereof along the arrow X-direction becomes 20 mm× (60−1)=1180 mm. Also, it is assumed that a distance defined between the components supplying port 15 of the components supplying region S and the closest edge in the board 9 from this components supplying port 15 is 40 mm.

Figure 5:
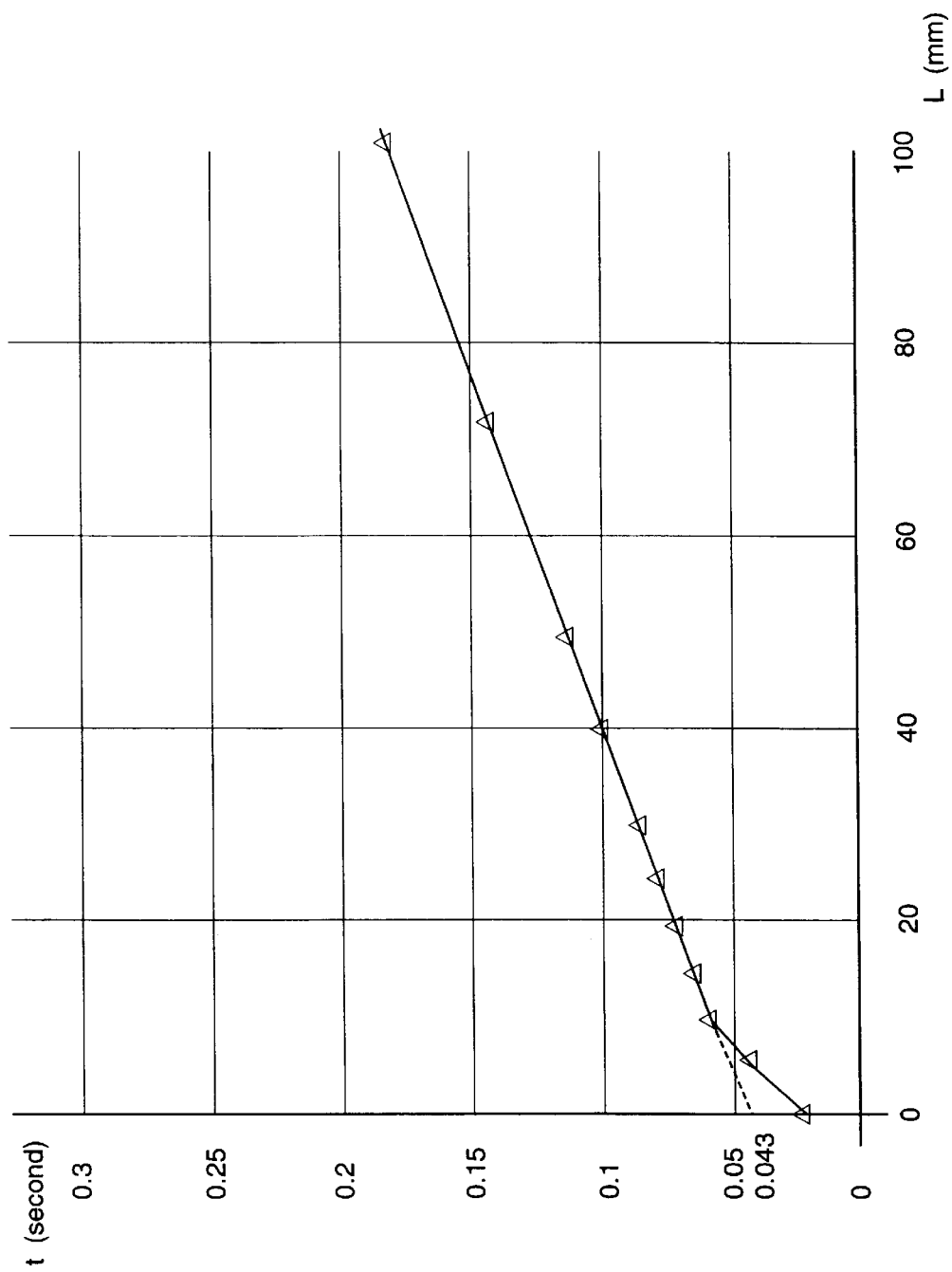
FIG. 5 is a graphical representation for representing a motor speed characteristic of an X-Y direction transport motor used in the components mounting apparatus of FIG. 1.
Figure 6:
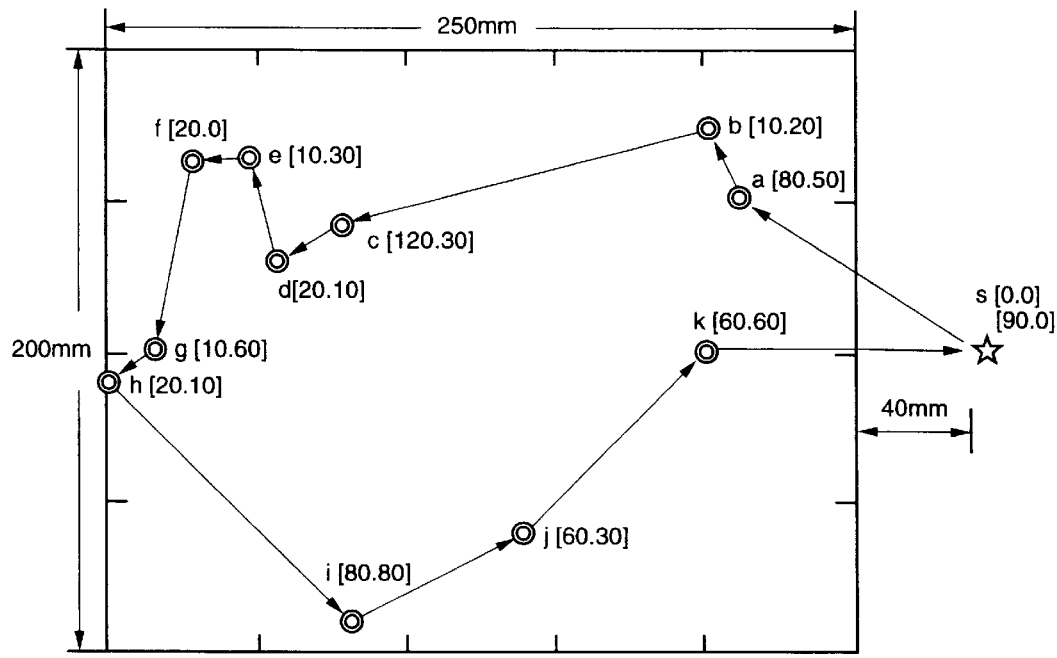
FIG. 6 is an explanatory diagram for explaining a first transport path of the tool head over a plane in a components mounting method according to a first embodiment of the present invention.
Figure 7:
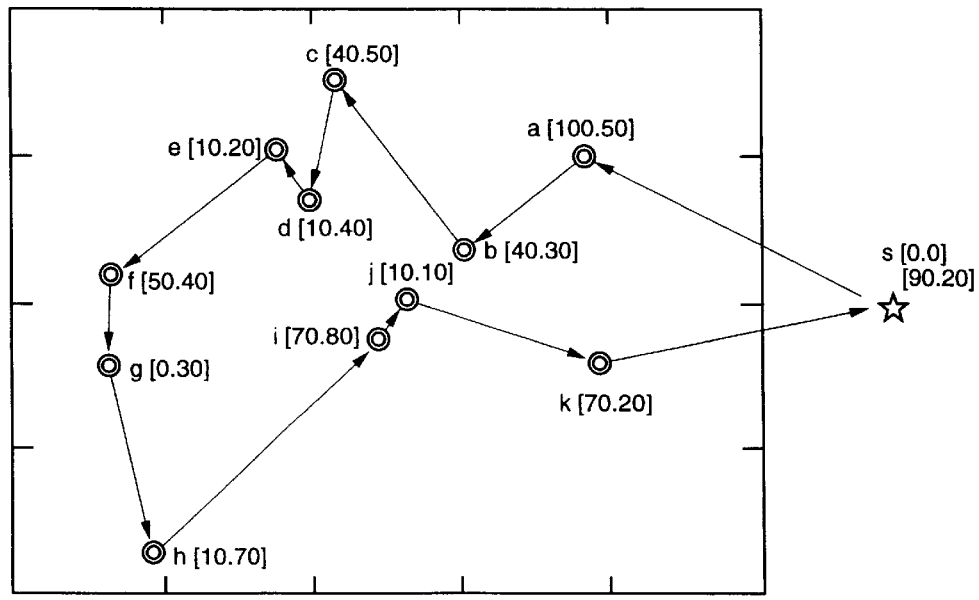
FIG. 7 is an explanatory diagram for explaining a second transport path of the tool head over the plane in accordance with the first components mounting method.
Figure 8:
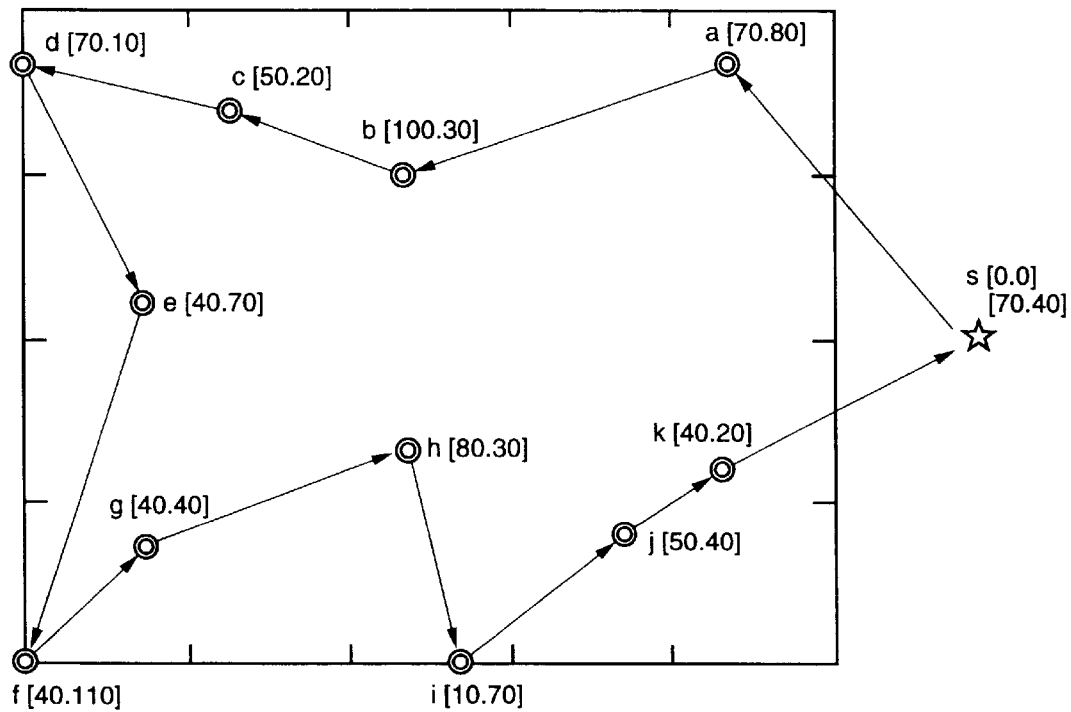
FIG. 8 is an explanatory diagram for explaining a third transport path of the tool head over the plane in accordance with the first components mounting method.
Figure 9:
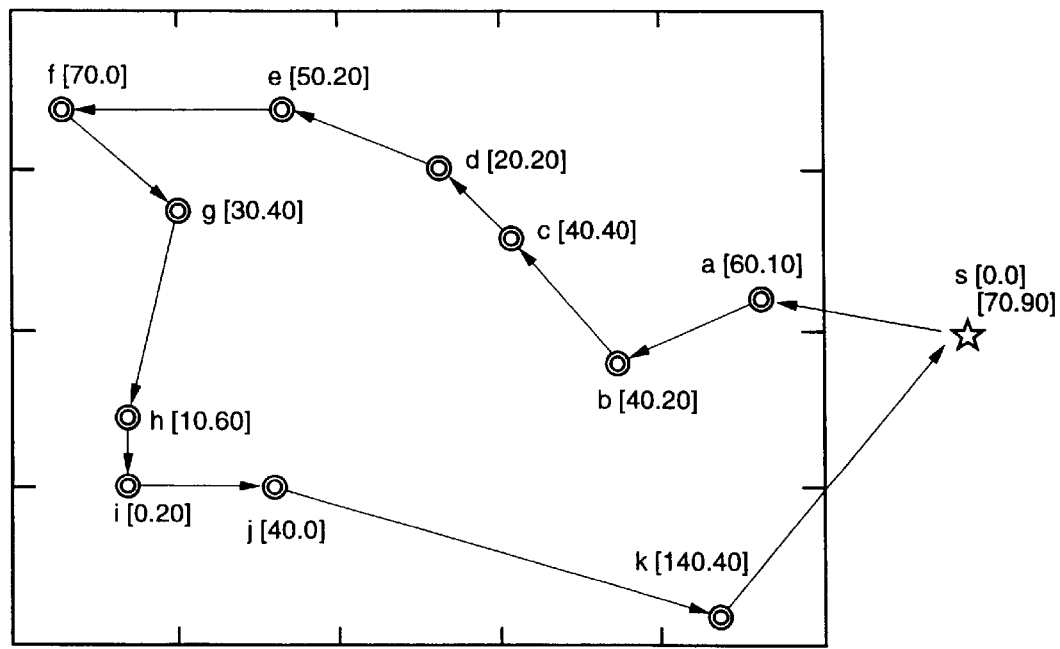
FIG. 9 is an explanatory diagram for explaining a fourth transport path of the tool head over the plane in accordance with the first components mounting method.
Figure 10:
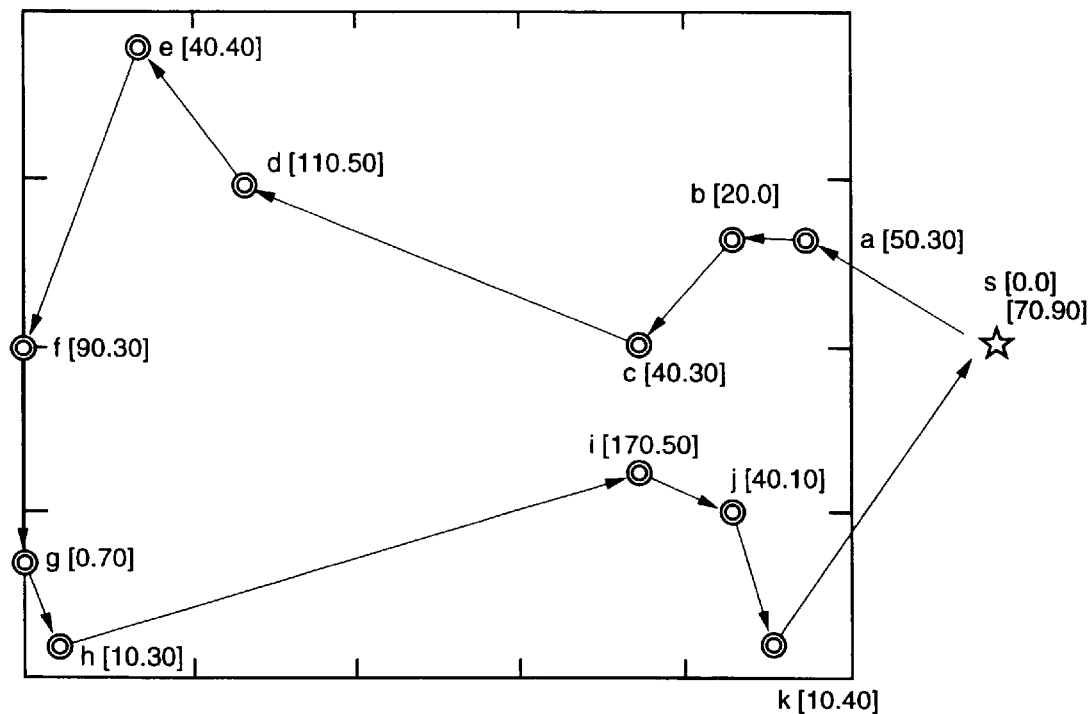
FIG. 10 is an explanatory diagram for explaining a fifth transport path of the tool head over the plane in accordance with the first components mounting method.
Figure 11:
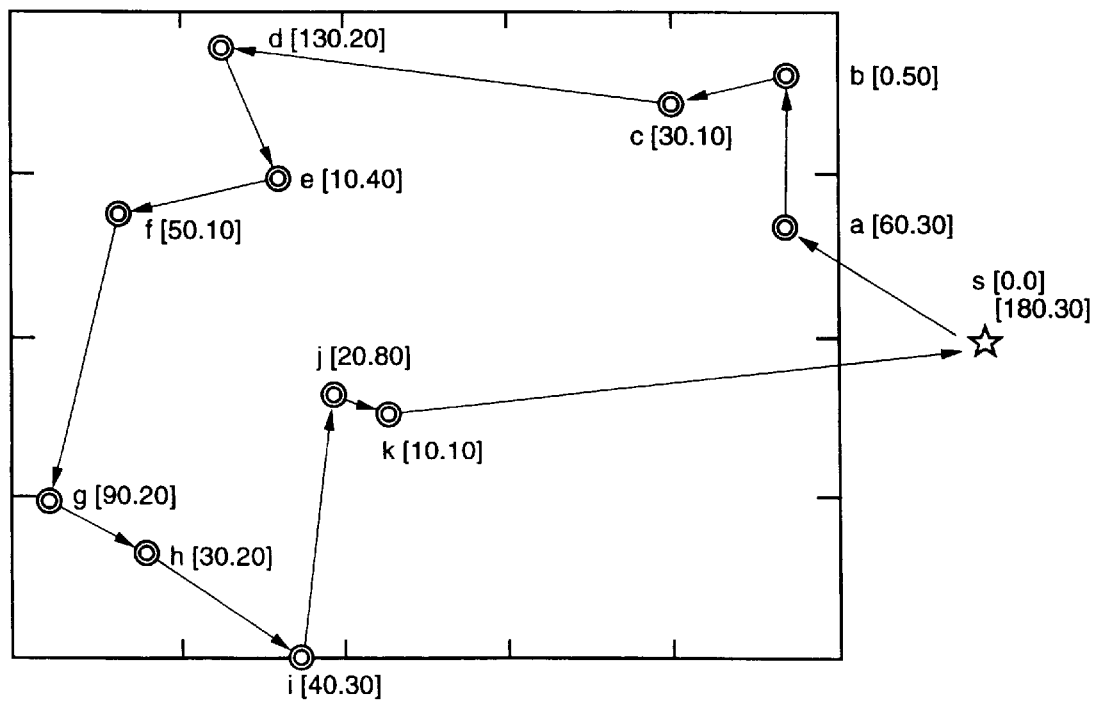
FIG. 11 is an explanatory diagram for explaining a sixth transport path of the tool head over the plane in accordance with the first components mounting method.
Figure 12:
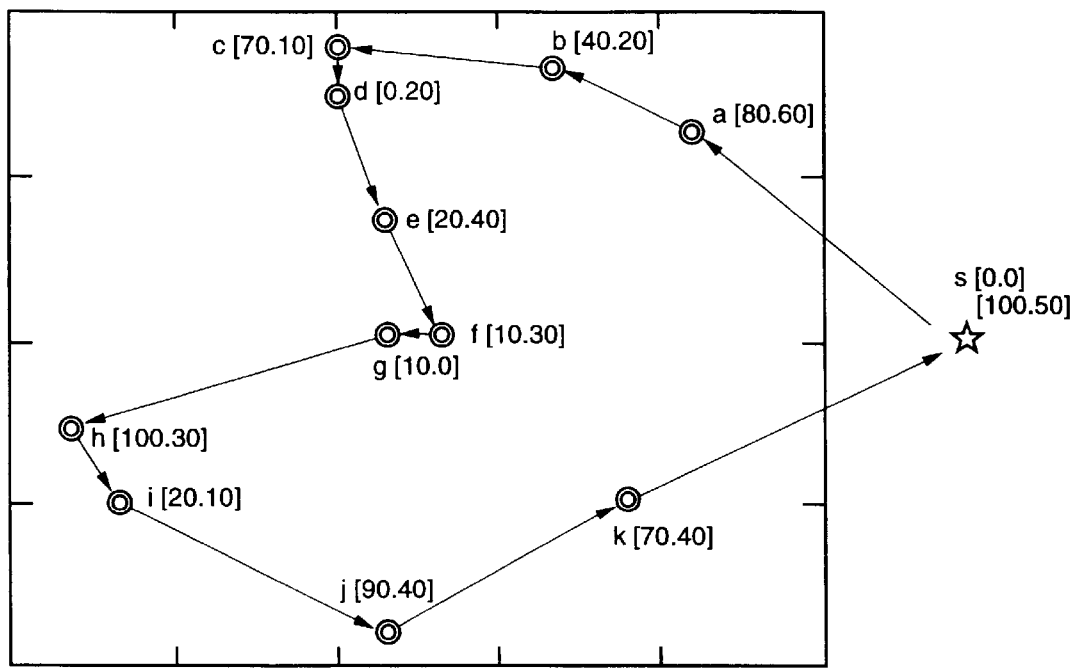
FIG. 12 is an explanatory diagram for explaining a seventh transport path of the tool head over the plane in accordance with the first components mounting method.
Figure 13:
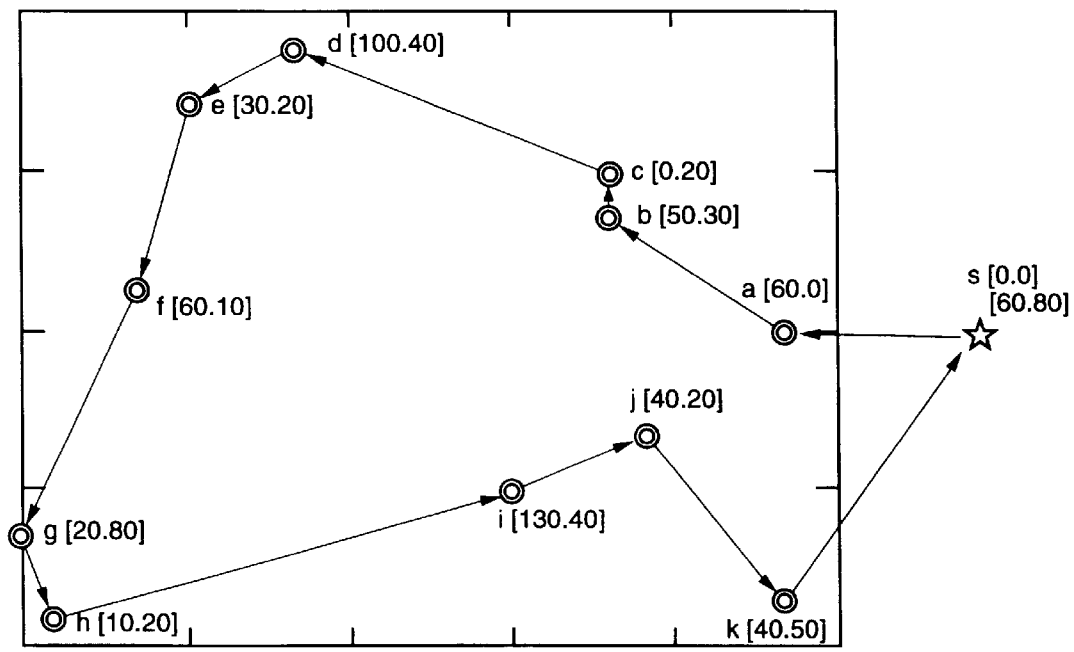
FIG. 13 is an explanatory diagram for explaining an eighth transport path of the tool head over the plane in accordance with the first components mounting method.
Figure 14:
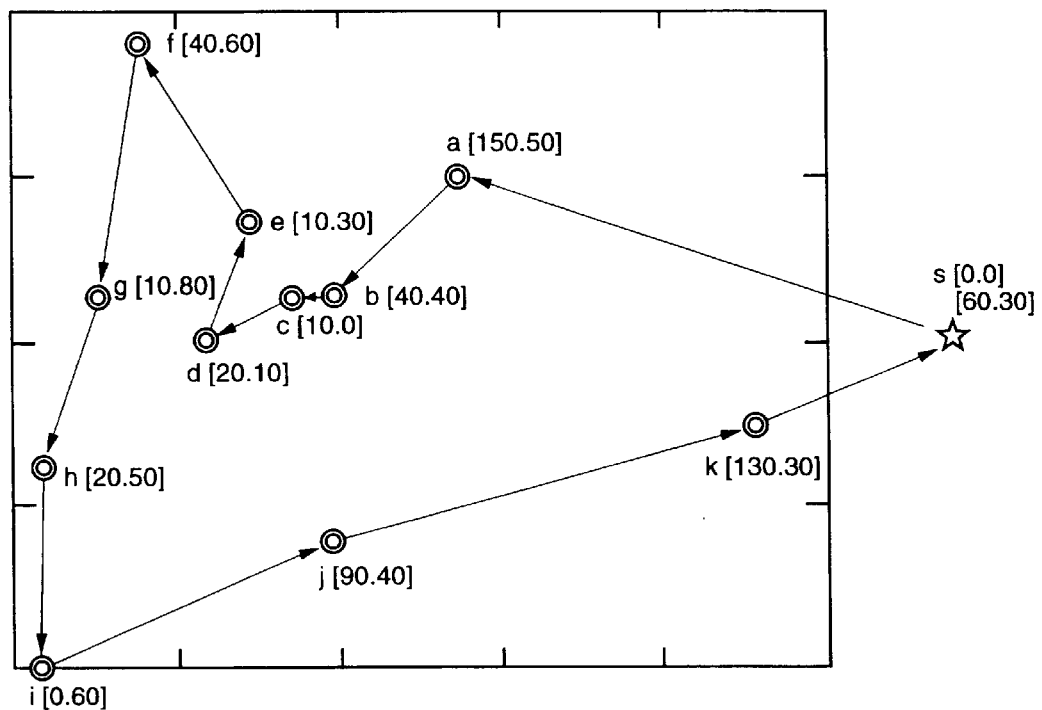
FIG. 14 is an explanatory diagram for explaining a ninth transport path of the tool head over the plane in accordance with the first components mounting method.
Figure 15:
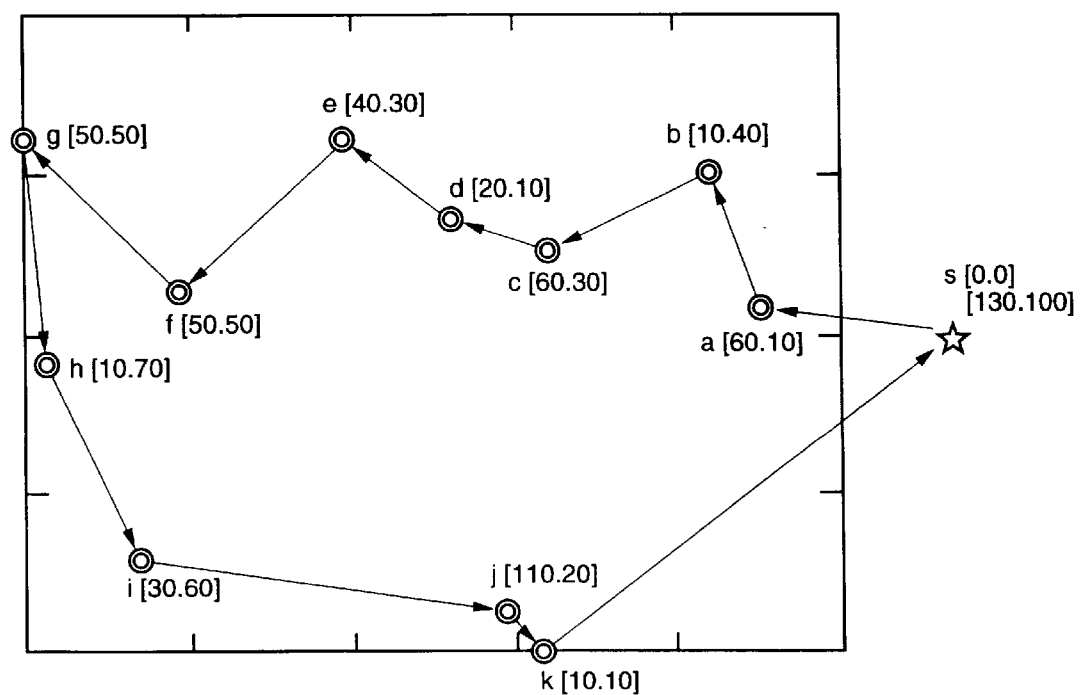
FIG. 15 is an explanatory diagram for explaining a tenth transport path of the tool head over the plane in accordance with the first components mounting method.

It should be understood that as is known, the transport speed of the tool head along the horizontal (X-Y direction) in the existing (conventional) components mounting apparatus is practically 40 mm/0.1 second. Since it slightly takes time until the tool head becomes uniform motion, as indicated by a solid line of FIG. 5, the tool head starts to move after 0.02 seconds when a start instruction is issued, and the motion of this tool head becomes uniform after 0.07 seconds when this start instruction is issued, namely after the tool head has passed the point of 20 mm. Then, when the speed graph line of this conventional tool head is expressed by linear approximation formula (will be referred to as a "conversion formula" hereinafter), it is given as follows:

$$t=0.043+(0.055 \times \text{transport distance}/40) \text{ seconds.}$$

In this graphic representation, the motion of the tool head is under acceleration condition during t<0.07 seconds. Even when the transport time is calculated based on the above-described linear approximation formula under this acceleration condition (namely, portion indicated by a dotted line of FIG. 5), since the transport time becomes longer than the actual transport time with respect to the transport distance, there is no problem in proving that it is fast.

Practically speaking, the time required to transport the absorbing nozzle 8 along the vertical direction is 0.08 seconds, and the normal confirmation work requires 0.04 seconds. This confirmation work by a vision camera system (not shown) is required so as to confirm the direction of chip component 13 absorbed by the absorbing nozzle 8 in this components mounting apparatus 1. Moreover, it is designed such that an average interval between the chip component 13 and the chip component 13 mounted on the board 9 is approximately 10 mm.

On the other hand, assuming now that one chip component 13 is mounted on a central position (functioning as a typical point) of the board 9, the absorbing nozzle 8 must be moved over the minimum distance (namely, 40+250/2 =165 mm) from the components supplying port 15. To move this absorbing nozzle 8 over this minimum distance, it would take 165/400 = approximately 0.4125 seconds. As a consequence, the above-described target mounting tact time of 0.4 seconds/chip could not be achieved.

COMPONENTS MOUNTING METHODS

As a consequence, in accordance with the components mounting method according to the present invention, since the member of tool head transport between the components supplying regions S and the components mounting region M is reduced as being permitted as possible, the above-described target mounting tact time can be achieved. For the sake of simple explanations, the components supplying region S of the components mounting apparatus 1 exists only on a single side of the components mounting region M in the below-mentioned embodiments.

In accordance with a components mounting method of a first embodiments of the present invention, a large quantity of chip components 13, - - - , 13 are absorbed as many as from the components supplying region S by 20 sets of absorbing nozzles 8, - - - , 8 provided on the tool head 7, and this tool head 7 is transported to the components mounting region M, so that the respective chip components 13, - - - , 13 are mounted on the board 9.

When a plurality of chip components 13, - - - , 13 are mounted in this manner, the transport of the tool head 7 between the components supplying region S and the components mounting region M may be carried out only one time, so that the transport time per single chip component 13 between the above-described two regions can be reduced. As a result, the mounting speed (mounting tact time) can be shortened.

Next, a more concrete explanation will be made how to shorten the mounting tact time of the chip component 13.

As previously described, the mounting tact time per single chip component is assumed as follows. That is, 0.4 seconds correspond to the target mounting tact time. In this target mounting tact time of 0.4 seconds, 0.2 seconds are required by adding time of 0.08×2=0.16 seconds which require the up/down movement of the absorbing nozzle 8 (during absorbing operation, and mounting operation) to confirmation time of 0.04 seconds required for confirming the absorption condition of the chip component 13 by using the vision camera system. Accordingly, the tool head must be transported along the X-Y direction within 0.2 seconds (=0.4–0.2).

Moreover, this X-Y target transport time of 0.2 seconds corresponds to a total of target transport times of the tool head 7 between the components supplying region S and the components mounting region M. As a consequence, assuming now that the transport time of the tool head 7 in the components supplying region S is equal to that in the components mounting region M in view of averaged values, the target transport time of the tool head 7 in each of these components supplying/mounting regions becomes 0.1 second. It should be understood that the transport time between the component supplying region S and the components mounting region M is merged into the target transport time in the components mounting region M to be calculated.

While using the above-described 0.1 second as each of the target transport times for the tool head 7 in the components supplying region S and the components mounting region M (will be referred to as a "region-S target transport time" and a "region-M target transport time", a sequential operation for absorbing or mounting the chip components 13, - - - , 13 will now be explained. It is assumed that 20 absorbing nozzles 8, - - - , 8 mounted on the tool head 7 may absorb 11 pieces of chip components 13, 13 while these absorbing nozzles are transported within the components supplying region S one time. This assumption is established from the following prediction. That is, if desired chip components are absorbed by all of 20 absorbing nozzles 8, - - - , 8, then the transport range of these absorbing nozzles will be extended within the components supplying region S, so that the above-explained target transport time of 0.1 second within the components supplying region S could not be achieved.

As a consequence, the components supplying region S (its entire length: 1,180 mm) is subdivided into some sections. An assumption is made that the tool head is transported in a range of a transport distance within this subdivided straight line, and then 11 pieces of chip components 13, - - - , 13 are absorbed.

It should be understood that although in this embodiment, the components supplying region S is subdivided into several sections and the tool head 7 is transported within the area of this subdivided section, a decision as to whether or not the components supplying region S is subdivided may be made based on the quantity of absorbing nozzles 8, - - - , 8 mounted on the tool head 7, the dimension of the board 9, and either the type or the quantity of chip components 13, - - - , 13 to be mounted. It is of course possible to apply the components mounting method according to the present invention to a case where the components supplying region S is not subdivided.

Therefore, a length of a subdivided straight line (namely, a transport distance within a straight line) is determined, 11 points are selected at random within this range, and a check is made as to whether or not the average transport time between these points becomes the above-described region-S target transport time of 0.1 second, so that the subdivided transport distance within the straight line is determined in which the transport time is shorter than, or nearly equal to the above-described region-S target transport time of 0.1 second.

Concretely speaking, the following investigation will be made as to such a case that the subdivided transport distances within the straight line are 800 mm, 600 mm, 400 mm, and 200 mm.

In any one of these subdivided transport distances within the straight line, 10 sets of cases are investigated. A calculation is made of an average transport time as to each of these 10 cases, and further a total value of these average values is calculated.

In a table 1 to a table 4, random numbers in a distance implies 11 point (a, b, c, - - - , k) selected based on the random numbers within a predetermined length. These points are rearranged in a small order and then represented in the respective tables. Transport distances among the respective points imply that distances (ab, bc, cd, - - - , jk) among the above-described points (a, b, c, - - - , k) and points adjacent to these points are displayed. Transport time indicates transport time between the respective times by substituting the above-described transport distances among the respective points for the above-described conversion formula.

The table 1 indicates such a case that the transport distance within the straight line is 800 mm.

TABLE 1

| Condition 1 distance: | 80 mm |
| number of target point: | 11 points |
| distance/time conversion: | (conversion formula = 0.043 + (0.055 × transport distance/40)) |

| | random number within distance (rearranged) | | | | | | | | | | |
| --- | --- | --- | --- | --- | --- | --- | --- | --- | --- | --- | --- |
| | a | b | c | d | e | f | g | h | i | j | k |
| case 1 | 64 | 146 | 150 | 176 | 196 | 252 | 254 | 288 | 372 | 440 | 724 |
| case 2 | 104 | 232 | 436 | 452 | 462 | 500 | 598 | 602 | 624 | 662 | 752 |
| case 3 | 0 | 68 | 74 | 96 | 308 | 578 | 624 | 630 | 636 | 644 | 664 |
| case 4 | 20 | 98 | 162 | 264 | 436 | 448 | 512 | 608 | 650 | 696 | 758 |
| case 5 | 14 | 26 | 220 | 296 | 332 | 396 | 424 | 436 | 508 | 678 | 734 |
| case 6 | 38 | 208 | 232 | 266 | 316 | 386 | 388 | 612 | 666 | 756 | 768 |
| case 7 | 22 | 98 | 142 | 254 | 296 | 372 | 450 | 494 | 570 | 636 | 730 |
| case 8 | 60 | 196 | 282 | 318 | 334 | 338 | 566 | 572 | 650 | 726 | 750 |
| case 9 | 36 | 190 | 290 | 318 | 374 | 390 | 420 | 564 | 636 | 700 | 794 |
| case 10 | 24 | 48 | 148 | 180 | 504 | 604 | 664 | 720 | 756 | 768 | 788 |

| | transport distance amoung points (mm) | | | | | | | | | |
| --- | --- | --- | --- | --- | --- | --- | --- | --- | --- | --- |
| | ab | bc | cd | de | ef | fg | gh | hi | ij | jk |
| case 1 | 82 | 4 | 26 | 20 | 56 | 2 | 34 | 84 | 68 | 284 |
| case 2 | 128 | 204 | 16 | 10 | 38 | 98 | 4 | 22 | 38 | 90 |
| case 3 | 68 | 6 | 22 | 212 | 270 | 46 | 6 | 6 | 8 | 20 |
| case 4 | 78 | 64 | 102 | 172 | 12 | 64 | 96 | 42 | 46 | 62 |
| case 5 | 12 | 194 | 76 | 36 | 64 | 28 | 12 | 72 | 170 | 56 |
| case 6 | 170 | 24 | 34 | 50 | 70 | 2 | 224 | 54 | 90 | 12 |
| case 7 | 76 | 44 | 112 | 42 | 76 | 78 | 44 | 76 | 66 | 94 |
| case 8 | 136 | 86 | 36 | 16 | 4 | 228 | 6 | 78 | 76 | 24 |
| case 9 | 154 | 100 | 28 | 56 | 16 | 30 | 144 | 72 | 64 | 94 |
| case 10 | 24 | 100 | 32 | 324 | 100 | 60 | 56 | 36 | 12 | 20 |

| | transport time (sec) | | | | | | | | | | |
| --- | --- | --- | --- | --- | --- | --- | --- | --- | --- | --- | --- |
| | ab | bc | cd | de | ef | fg | gh | hi | ij | jk | averaged value |
| case 1 | 0.16 | 0.05 | 0.08 | 0.07 | 0.12 | 0.05 | 0.09 | 0.16 | 0.14 | 0.43 | 0.134 |
| case 2 | 0.22 | 0.32 | 0.07 | 0.06 | 0.10 | 0.18 | 0.05 | 0.07 | 0.10 | 0.17 | 0.132 |
| case 3 | 0.14 | 0.05 | 0.07 | 0.33 | 0.41 | 0.11 | 0.05 | 0.05 | 0.05 | 0.07 | 0.134 |
| case 4 | 0.15 | 0.13 | 0.18 | 0.28 | 0.06 | 0.13 | 0.18 | 0.10 | 0.11 | 0.13 | 0.144 |
| case 5 | 0.06 | 0.31 | 0.15 | 0.09 | 0.13 | 0.08 | 0.06 | 0.14 | 0.28 | 0.12 | 0.142 |
| case 6 | 0.28 | 0.08 | 0.09 | 0.11 | 0.14 | 0.05 | 0.35 | 0.12 | 0.17 | 0.06 | 0.143 |
| case 7 | 0.15 | 0.10 | 0.20 | 0.10 | 0.15 | 0.15 | 0.10 | 0.15 | 0.13 | 0.17 | 0.14 |

TABLE 1-continued

| | Condition 1 distance: | 80 mm |
|---|---|---|
| | number of target point: | 11 points |
| | distance/time conversion: | (conversion formula = 0.043 + (0.055 × transport distance/40)) |

| | | | | | | | | | | | |
|---|---|---|---|---|---|---|---|---|---|---|---|
| case 8 | 0.23 | 0.16 | 0.09 | 0.07 | 0.05 | 0.36 | 0.05 | 0.15 | 0.15 | 0.08 | 0.138 |
| case 9 | 0.25 | 0.18 | 0.08 | 0.12 | 0.07 | 0.08 | 0.24 | 0.14 | 0.13 | 0.17 | 0.147 |
| case 10 | 0.08 | 0.18 | 0.09 | 0.49 | 0.18 | 0.13 | 0.12 | 0.09 | 0.06 | 0.07 | 0.148 | total averaged value of 0.14SEC

Considering now a case 1 in the table 1, the points (a, b, - - - , k) selected at random are given as follows: a: 64, b: 146, c: 150, d: 176, e: 196, f: 252, g: 254, h: 288, i: 372, j: 440, k: 724. The distances among the respective points are given as follows: ab: 82, bc: 4, cd: 26, de: 20, ef: 56, fg: 2, gh: 34, hi: 84, ij: 68, jk: 284 (mm).

When these values are used in the above-described conversion formula to calculate the transport times among the respective points, these transport times are given as follows: ab: 0.16, bc: 0.05, cd: 0.08, de: 0.07, ef: 0.12, fg: 0.05, gh: 0.09, hi: 0.16, ij: 0.14, jk: 0.4 (seconds). An averaged value of these transport times is given as 0.134 seconds.

When averaged values of the respective transport times are similarly calculated from a case 2 to a case 10, these values are given as follows: case 2: 0.132, case 3: 0.134, case 4: 0.144, case 5: 0.142, case 6: 0.143, case 7: 0.14, case 8: 0.138, case 9: 0.147, case 10: 0.148 (seconds). Furthermore, when an averaged value of the summed transport times is calculated, it becomes 0.14 seconds.

As a result, since the above-described averaged value of 0.14 seconds becomes longer than the above-defined region-S target transport time of 0.1 second, it can be understood that the transport distance within a straight line of 800 mm could not be employed.

A table 2 indicates such a case that the transport distance within a straight line is 600 mm.

TABLE 2

| | Condition 2 distance: | 600 mm |
|---|---|---|
| | number of target point: | 11 points |
| | distance/time conversion: | (conversion formula = 0.043 + (0.055 × transport distance/40)) | random number within distance (rearranged)

| | a | b | c | d | e | f | g | h | i | j | k |
|---|---|---|---|---|---|---|---|---|---|---|---|
| case 1 | 48 | 109.5 | 112.5 | 132 | 147 | 189 | 190.5 | 216 | 279 | 330 | 543 |
| case 2 | 78 | 174 | 327 | 339 | 346.5 | 375 | 448.5 | 451.5 | 468 | 496.5 | 564 |
| case 3 | 0 | 51 | 55.5 | 72 | 231 | 433.5 | 468 | 472.5 | 477 | 483 | 498 |
| case 4 | 15 | 73.5 | 121.5 | 198 | 327 | 336 | 384 | 456 | 487.5 | 522 | 568.5 |
| case 5 | 10.5 | 19.5 | 165 | 222 | 249 | 297 | 318 | 327 | 381 | 508.5 | 550.5 |
| case 6 | 28.5 | 156 | 174 | 199.5 | 237 | 289.5 | 291 | 459 | 499.5 | 567 | 576 |
| case 7 | 16.5 | 73.5 | 106.5 | 190.5 | 222 | 279 | 337.5 | 370.5 | 427.5 | 477 | 547.5 |
| case 8 | 45 | 147 | 211.5 | 238.5 | 250.5 | 253.5 | 424.5 | 429 | 487.5 | 544.5 | 562.5 |
| case 9 | 27 | 142.5 | 217.5 | 238.5 | 280.5 | 292.5 | 315 | 423 | 477 | 525 | 595.5 |
| case 10 | 18 | 36 | 111 | 135 | 378 | 453 | 498 | 540 | 567 | 576 | 591 | transport distance among points (mm)

| | ab | bc | cd | de | ef | fg | gh | hi | ij | jk |
|---|---|---|---|---|---|---|---|---|---|---|
| case 1 | 61.5 | 3 | 19.5 | 15 | 42 | 1.5 | 25.5 | 63 | 51 | 213 |
| case 2 | 96 | 153 | 12 | 7.5 | 28.5 | 73.5 | 3 | 16.5 | 28.5 | 67.5 |
| case 3 | 51 | 4.5 | 16.5 | 159 | 202.5 | 34.5 | 4.5 | 4.5 | 6 | 15 |
| case 4 | 58.5 | 48 | 76.5 | 129 | 9 | 48 | 72 | 31.5 | 34.5 | 46.5 |
| case s | 9 | 145.5 | 57 | 27 | 48 | 21 | 9 | 54 | 127.5 | 42 |
| case 6 | 127.5 | 18 | 25.5 | 37.5 | 52.5 | 1.5 | 168 | 40.5 | 67.5 | 9 |
| case 7 | 57 | 33 | 84 | 31.5 | 57 | 58.5 | 33 | 57 | 49.5 | 70.5 |
| case 8 | 102 | 64.5 | 27 | 12 | 3 | 171 | 4.5 | 58.5 | 57 | 18 |
| case 9 | 115.5 | 75 | 21 | 42 | 12 | 22.5 | 108 | 54 | 48 | 70.5 |
| case 10 | 18 | 75 | 24 | 243 | 75 | 45 | 42 | 27 | 9 | 15 | transport time (sec)

| | ab | bc | cd | de | ef | fg | gh | hi | ij | jk | averaged value |
|---|---|---|---|---|---|---|---|---|---|---|---|
| case 1 | 0.13 | 0.05 | 0.07 | 0.06 | 0.10 | 0.05 | 0.08 | 0.13 | 0.11 | 0.34 | 0.111 |
| case 2 | 0.18 | 0.25 | 0.06 | 0.05 | 0.08 | 0.14 | 0.05 | 0.07 | 0.08 | 0.14 | 0.11 |
| case 3 | 0.11 | 0.05 | 0.07 | 0.26 | 0.32 | 0.09 | 0.05 | 0.05 | 0.05 | 0.06 | 0.111 |
| case 4 | 0.12 | 0.11 | 0.15 | 0.22 | 0.06 | 0.11 | 0.14 | 0.09 | 0.09 | 0.11 | 0.119 |
| case 5 | 0.06 | 0.24 | 0.12 | 0.08 | 0.11 | 0.07 | 0.06 | 0.12 | 0.22 | 0.10 | 0.117 |
| case 6 | 0.22 | 0.07 | 0.08 | 0.09 | 0.12 | 0.05 | 0.27 | 0.10 | 0.14 | 0.06 | 0.118 |

TABLE 2-continued

| | Condition 2 distance: | | | | | 600 mm | | | | | |
|---|---|---|---|---|---|---|---|---|---|---|---|
| | number of target point: | | | | | 11 points | | | | | |
| | distance/time conversion: | | | | | (conversion formula = 0.043 + (0.055 × transport distance/40)) | | | | | |
| case 7 | 0.12 | 0.09 | 0.16 | 0.09 | 0.12 | 0.12 | 0.09 | 0.12 | 0.11 | 0.14 | 0.116 |
| case 8 | 0.18 | 0.13 | 0.08 | 0.06 | 0.05 | 0.28 | 0.05 | 0.12 | 0.12 | 0.07 | 0.114 |
| case 9 | 0.20 | 0.15 | 0.07 | 0.10 | 0.06 | 0.07 | 0.19 | 0.12 | 0.11 | 0.14 | 0.121 |
| case 10 | 0.07 | 0.15 | 0.08 | 0.38 | 0.15 | 0.10 | 0.10 | 0.08 | 0.06 | 0.06 | 0.122 |
| | | | | | | | | | total averaged value of 0.116SEC | | |

Considering the table 2, when an averaged value of transport times as to the transport distance within a straight line of 600 mm is calculated in a similar manner to the above table 1, it becomes 0.116 seconds.

As a result, since this averaged value of 0.116 seconds becomes longer than the region-S target transport time of 0.1 second, it can also be understood that the transport distance within a straight line of 600 mm could not be employed.

A table 3 indicates such a case that the transport distance within a straight line is 400 mm.

TABLE 3

| Condition 3 distance: | 400 mm |
|---|---|
| number of target point: | 11 points |
| distance/time conversion: | (conversion formula = 0.043 + (0.055 × transport distance/40)) |

| | random number within distance (rearranged) | | | | | | | | | | |
|---|---|---|---|---|---|---|---|---|---|---|---|
| | a | b | c | d | e | f | g | h | i | j | k |
| case 1 | 32 | 73 | 75 | 88 | 98 | 126 | 127 | 144 | 186 | 220 | 362 |
| case 2 | 52 | 116 | 218 | 226 | 231 | 250 | 299 | 301 | 312 | 331 | 376 |
| case 3 | 0 | 34 | 37 | 48 | 154 | 289 | 312 | 315 | 318 | 322 | 332 |
| case 4 | 10 | 49 | 81 | 132 | 218 | 224 | 256 | 304 | 325 | 348 | 379 |
| case 5 | 7 | 13 | 110 | 148 | 166 | 198 | 212 | 218 | 254 | 339 | 367 |
| case 6 | 19 | 104 | 116 | 133 | 158 | 193 | 194 | 306 | 333 | 378 | 384 |
| case 7 | 11 | 49 | 71 | 127 | 148 | 186 | 225 | 247 | 285 | 318 | 365 |
| case 8 | 30 | 98 | 141 | 159 | 167 | 169 | 283 | 286 | 325 | 363 | 375 |
| case 9 | 18 | 95 | 145 | 159 | 187 | 195 | 210 | 282 | 318 | 350 | 397 |
| case 10 | 12 | 24 | 74 | 90 | 252 | 302 | 332 | 360 | 378 | 384 | 394 |

| | transport distance among points (mm) | | | | | | | | | |
|---|---|---|---|---|---|---|---|---|---|---|
| | ab | bc | cd | de | ef | fg | gh | hi | ij | jk |
| case 1 | 41 | 2 | 13 | 10 | 28 | 1 | 17 | 42 | 34 | 142 |
| case 2 | 64 | 102 | 8 | 5 | 19 | 49 | 2 | 11 | 19 | 45 |
| case 3 | 34 | 3 | 11 | 106 | 135 | 23 | 3 | 3 | 4 | 10 |
| case 4 | 39 | 32 | 51 | 86 | 6 | 32 | 48 | 21 | 23 | 31 |
| case 5 | 6 | 97 | 38 | 18 | 32 | 14 | 6 | 36 | 85 | 28 |
| case 6 | 85 | 12 | 17 | 25 | 35 | 1 | 112 | 27 | 45 | 6 |
| case 7 | 38 | 22 | 56 | 21 | 38 | 39 | 22 | 38 | 33 | 47 |
| case 8 | 68 | 43 | 18 | 8 | 2 | 114 | 3 | 39 | 38 | 12 |
| case 9 | 77 | 50 | 14 | 28 | 8 | 15 | 72 | 36 | 32 | 47 |
| case 10 | 12 | 50 | 16 | 162 | 50 | 30 | 28 | 18 | 6 | 10 |

| | transport time (sec) | | | | | | | | | | |
|---|---|---|---|---|---|---|---|---|---|---|---|
| | ab | bc | cd | de | ef | fg | gh | hi | ij | jk | averaged value |
| case 1 | 0.10 | 0.05 | 0.06 | 0.06 | 0.08 | 0.04 | 0.07 | 0.10 | 0.09 | 0.24 | 0.088 |
| case 2 | 0.13 | 0.18 | 0.05 | 0.05 | 0.07 | 0.11 | 0.05 | 0.06 | 0.07 | 0.10 | 0.088 |
| case 3 | 0.09 | 0.05 | 0.06 | 0.19 | 0.23 | 0.07 | 0.05 | 0.05 | 0.05 | 0.06 | 0.089 |
| case 4 | 0.10 | 0.09 | 0.11 | 0.16 | 0.05 | 0.09 | 0.11 | 0.07 | 0.07 | 0.09 | 0.094 |
| case 5 | 0.05 | 0.18 | 0.10 | 0.07 | 0.09 | 0.06 | 0.05 | 0.09 | 0.16 | 0.08 | 0.093 |
| case 6 | 0.16 | 0.06 | 0.07 | 0.08 | 0.09 | 0.04 | 0.20 | 0.08 | 0.10 | 0.05 | 0.093 |
| case 7 | 0.10 | 0.07 | 0.12 | 0.07 | 0.10 | 0.10 | 0.07 | 0.10 | 0.09 | 0.11 | 0.092 |
| case 8 | 0.14 | 0.10 | 0.07 | 0.05 | 0.05 | 0.20 | 0.05 | 0.10 | 0.10 | 6.06 | 0.09 |
| case 9 | 0.15 | 0.11 | 0.06 | 0.08 | 0.05 | 0.06 | 0.14 | 0.09 | 0.09 | 0.11 | 0.095 |
| case 10 | 0.06 | 0.11 | 0.07 | 0.27 | 0.11 | 0.08 | 0.08 | 0.07 | 0.05 | 0.06 | 0.096 |
| | | | | | | | | | total averaged value of 0.092SEC | | |

Considering the table 3, when an averaged value of transport times as to the transport distance within a straight line of 400 mm is calculated in a similar manner to the above table 1, it becomes 0.092 seconds.

As a result, since this averaged value of 0.092 seconds becomes shorter than the region-S target transport time of 0.1 second, it can also be understood that the transport distance within a straight line of 400 mm could be employed.

A table 4 indicates such a case that the transport distance within a straight line is 200 mm.

As previously explained, when the tool head 7 is transported within the straight line, if the transport distance within this straight line is smaller than, or equal to 400 mm, then it can be seen that the region-S target transport time of 0.1 second could be achieved.

Next, another investigation is carried out for a case where the tool head 7 is moved in a plane manner (namely, X-Y direction) within the components mounting region M. As explained above, the dimension of the board 9 is 250 mm×400 mm. If the tool head 7 is moved within this entire range along the X-Y direction, then since this range is too

TABLE 4

| | | | | | | | | | | |
|---|---|---|---|---|---|---|---|---|---|---|
| Condition 4 distance: | | | 200 mm | | | | | | | |
| number of target point: | | | 11 points | | | | | | | |
| distance/time conversion: | | | (conversion formula = 0.043 + (0.055 × transport distance/40)) | | | | | | | |

| | random number within distance (rearranged) | | | | | | | | | |
|---|---|---|---|---|---|---|---|---|---|---|
| | a | b | c | d | e | f | g | h | i | j | k |
| case 1 | 16 | 36.5 | 37.5 | 44 | 49 | 63 | 63.5 | 72 | 93 | 110 | 181 |
| case 2 | 26 | 58 | 109 | 113 | 115.5 | 125 | 149.5 | 150.5 | 156 | 165.5 | 188 |
| case 3 | 0 | 17 | 18.5 | 24 | 77 | 144.5 | 156 | 157.5 | 159 | 161 | 166 |
| case 4 | 5 | 24.5 | 40.5 | 66 | 109 | 112 | 128 | 152 | 162.5 | 174 | 189.5 |
| case 5 | 35 | 6.5 | 55 | 74 | 83 | 99 | 106 | 109 | 127 | 169.5 | 183.5 |
| case 6 | 9.5 | 52 | 58 | 66.5 | 79 | 96.5 | 97 | 153 | 166.5 | 189 | 192 |
| case 7 | 5.5 | 24.5 | 35.5 | 63.5 | 74 | 93 | 112.5 | 123.5 | 142.5 | 159 | 182.5 |
| case 8 | 15 | 49 | 70.5 | 79.5 | 83.5 | 84.5 | 141.5 | 143 | 163.5 | 181.5 | 187.5 |
| case 9 | 9 | 47.5 | 72.5 | 789.5 | 93.5 | 97.5 | 106 | 141 | 159 | 175 | 198.5 |
| case 10 | 6 | 12 | 37 | 45 | 126 | 151 | 166 | 180 | 189 | 192 | 197 |

| | transport distance among points (mm) | | | | | | | | | |
|---|---|---|---|---|---|---|---|---|---|---|
| | ab | bc | cd | de | ef | fg | gh | hi | ij | jk |
| case 1 | 20.5 | 1 | 6.5 | 5 | 14 | 0.5 | 8.5 | 21 | 17 | 71 |
| case 2 | 32 | 51 | 4 | 2.5 | 9.5 | 24.5 | 1 | 5.5 | 9.5 | 22.5 |
| case 3 | 17 | 1.5 | 55 | 53 | 67.5 | 11.5 | 1.5 | 1.5 | 2 | 5 |
| case 4 | 19.5 | 16 | 25.5 | 43 | 3 | 16 | 24 | 10.5 | 11.5 | 15.5 |
| case 5 | 3 | 48.5 | 19 | 9 | 16 | 7 | 3 | 18 | 42.5 | 14 |
| case 6 | 42.5 | 6 | 8.5 | 12.5 | 17.5 | 0.5 | 56 | 13.5 | 22.5 | 3 |
| case 7 | 19 | 11 | 28 | 10.5 | 19 | 19.5 | 11 | 19 | 16.5 | 23.5 |
| case 8 | 34 | 21.5 | 9 | 4 | 1 | 57 | 1.5 | 19.5 | 19 | 6 |
| case 9 | 38.5 | 25 | 7 | 14 | 4 | 7.5 | 36 | 18 | 16 | 23.5 |
| case 10 | 6 | 25 | 8 | 81 | 25 | 15 | 14 | 9 | 3 | 5 |

| | transport time (sec) | | | | | | | | | | |
|---|---|---|---|---|---|---|---|---|---|---|---|
| | ab | bc | cd | de | ef | fg | gh | hi | ij | jk | averaged value |
| case 1 | 0.07 | 0.04 | 0.05 | 0.05 | 0.06 | 0.04 | 0.05 | 0.07 | 0.07 | 0.14 | 0.066 |
| case 2 | 0.09 | 0.11 | 0.05 | 0.05 | 0.06 | 0.08 | 0.04 | 0.05 | 0.06 | 0.07 | 0.065 |
| case 3 | 0.07 | 0.05 | 0.05 | 0.12 | 0.14 | 0.06 | 0.05 | 0.05 | 0.05 | 0.05 | 0.066 |
| case 4 | 0.07 | 0.07 | 0.08 | 0.10 | 0.05 | 0.07 | 0.08 | 0.06 | 0.06 | 0.06 | 0.068 |
| case 5 | 0.05 | 0.11 | 0.07 | 0.06 | 0.07 | 0.05 | 0.05 | 0.07 | 0.10 | 0.06 | 0.068 |
| case 6 | 0.10 | 0.05 | 0.05 | 0.06 | 0.07 | 0.04 | 0.12 | 0.06 | 0.07 | 0.05 | 0.068 |
| case 7 | 0.07 | 0.06 | 0.08 | 0.06 | 0.07 | 0.07 | 0.06 | 0.07 | 0.07 | 0.08 | 0.067 |
| case 8 | 0.09 | 0.07 | 0.06 | 0.05 | 0.04 | 0.12 | 0.05 | 0.07 | 0.07 | 0.05 | 0.067 |
| case 9 | 0.10 | 0.08 | 0.05 | 0.06 | 0.05 | 0.05 | 0.09 | 0.07 | 0.07 | 0.05 | 0.069 |
| case 10 | 0.05 | 0.08 | 0.05 | 0.15 | 0.08 | 0.06 | 0.06 | 0.06 | 0.05 | 0.05 | 0.069 |
| | | | | | | | | | | total averaged value of 0.067SEC | |

Considering the table 4, when an averaged value of transport times as to the transport distance within a straight line of 200 mm is calculated in a similar manner to the above table 1, it becomes 0.067 seconds.

As a result, since this averaged value of 0.067 seconds becomes shorter than the region-S target transport time of 0.1 second, it can also be understood that the transport distance within a straight line of 200 mm could be employed.

wide, it is predictable that the region-M target transport time of 0.1 second cannot be achieved. Then, the components mounting region M is properly subdivided into several subdivided plane sections in a similar manner to the above-described components supplying region S, and the following consideration is carried out under such a condition that the tool head 7 is transported within the subdivided plane section.

In this embodiment, the components mounting region M is subdivided into several section, and then the tool head 7 is transported within a subdivided section. Similar to the subject matter as to whether or not the components supplying region S is divided, a decision as to whether or not the components mounting region M is made based on such a condition, namely, the number of absorbing nozzles 8, - - - , 8 mounted on the tool head 7, the dimension of the board 9, and the sort or quantity of chip components 13, - - - , 13 to be mounted. It is of course possible to apply the component mounting method according to the present invention to such a case that the components mounting region M is not subdivided.

Then, a subdivided plane section is determined, and 11 points are selected at random within this subdivided plane section. A position is recognized as a starting point, which is located apart from a center of a short edge of each plane section, or a center of a long edge thereof by 40 mm outwardly. A path is determined from this starting point by properly connecting the above-described 11 points to each other in a predetermined sequence until the path returns to the starting point. Among the respective points, a longer component of the X-Y component is selected as a main axis. Then, a check is made as to whether or not an averaged transport time for the length of this main axis becomes the above-described region-M target transport time of 0.1 second. As a consequence, such a subdivided plane section is determined in which the averaged value is shorter than, or nearly equal to the region-M target transport time of 0.1 second.

Concretely speaking, the following investigation is performed as to three cases of subdivided plane sections, namely 250 mm×200 mm, 125 mm×200 mm, and 125 mm×100 mm.

In any one of the subdivided plane sections, 10 cases will now be considered. A calculation is made of an averaged value of transport times as to the respective cases, and further, a total value of averaged values is calculated.

It should be understood that the path starts from the starting point via 11 points in a predetermined sequential order and returns to the starting point and that this path may be determined by properly connecting these 11 points in accordance with the artificially better order, which are selected based on the random numbers on the plane. It should also be understood that the expression of "artificially better order" implies as follows. That is, while a point located at the closemost position, or the second closemost position with respect to the starting point "s" is selected as a first point within the component mounting region M among these 11 points, and also another point located at the second closemost position, or the closemost position from the starting point "s" among the 11 points is selected as a final point within the component mounting region M, these points are connected to each other.

FIG. 6 to FIG. 15 represent 10 cases in which a starting point is connected to 11 points selected based upon random numbers in a plane section defined by 250 mm×200 mm. Symbol "☆" denotes a starting/ending point (end point) "s", and point "⊙" shows 11 points (a, b, c, - - - , k) selected at random.

In a table 5 to a table 7, a transport amount implies that a two-point distance for connecting either a starting point or a point to another point is expressed by an X component and a Y component. For instance, an X component and a Y component of two-point distance for connecting the starting point "s" and a point "a" are indicated in a column "sa". Also, a transport amount of a main axis implies that among the above-described X components and Y components of the transport amounts, a longer transport amount is selected. A transport time is to indicate transport times among the respective points by substituting the transport amounts of the main axis among the respective points for the above-described conversion formula.

The table 5 indicates such a case that the plane section is defined by 250 mm×200 mm.

TABLE 5

| Condition 1 region: | 250 mm × 200 mm |
|---|---|
| starting point: | 40 mm outside center of short edge |
| end point: | " |
| number of target points: | 11 points within region |
| distance/time conversion: | (conversion formula = 0.043 + (0.055 × transport distance/40)) |

| | transport amount (X:axis of 250 · Y:axis of 200) | | | | | | | | | | | |
|---|---|---|---|---|---|---|---|---|---|---|---|---|
| | sa | ab | bc | cd | de | ef | fg | gh | hi | ij | jk | ks |
| case 1 (X) | 80 | 10 | 120 | 20 | 10 | 20 | 10 | 20 | 80 | 60 | 60 | 90 |
| (Y) | 50 | 20 | 30 | 10 | 30 | 0 | 60 | 10 | 80 | 30 | 60 | 0 |
| case 2 (X) | 100 | 40 | 40 | 10 | 10 | 50 | 0 | 10 | 70 | 10 | 70 | 90 |
| (Y) | 50 | 30 | 50 | 40 | 20 | 40 | 30 | 70 | 80 | 10 | 20 | 20 |
| case 3 (X) | 70 | 100 | 50 | 70 | 40 | 40 | 40 | 80 | 10 | 50 | 40 | 70 |
| (Y) | 80 | 30 | 20 | 10 | 70 | 110 | 40 | 30 | 70 | 40 | 20 | 40 |
| case 4 (X) | 60 | 40 | 40 | 20 | 50 | 70 | 30 | 10 | 0 | 40 | 140 | 70 |
| (Y) | 10 | 20 | 40 | 20 | 20 | 0 | 40 | 60 | 20 | 0 | 40 | 90 |
| case 5 (X) | 50 | 20 | 40 | 110 | 40 | 90 | 0 | 10 | 170 | 40 | 10 | 70 |
| (Y) | 30 | 0 | 30 | 50 | 40 | 30 | 70 | 30 | 50 | 10 | 40 | 90 |
| case 6 (X) | 60 | 0 | 30 | 130 | 10 | 50 | 90 | 30 | 40 | 20 | 10 | 180 |
| (Y) | 30 | 50 | 10 | 20 | 40 | 10 | 20 | 20 | 30 | 80 | 10 | 30 |
| case 7 (X) | 80 | 40 | 70 | 0 | 20 | 10 | 10 | 100 | 20 | 90 | 70 | 100 |
| (Y) | 60 | 20 | 10 | 20 | 40 | 30 | 0 | 30 | 10 | 40 | 40 | 50 |
| case 8 (X) | 60 | 50 | 0 | 100 | 30 | 60 | 20 | 10 | 130 | 40 | 40 | 60 |
| (Y) | 0 | 30 | 20 | 40 | 20 | 10 | 80 | 20 | 40 | 20 | 50 | 80 |
| case 9 (X) | 150 | 40 | 10 | 20 | 10 | 40 | 10 | 20 | 0 | 90 | 130 | 60 |
| (Y) | 50 | 40 | 0 | 10 | 30 | 60 | 80 | 50 | 60 | 40 | 30 | 30 |
| case 10 (X) | 60 | 10 | 60 | 20 | 40 | 50 | 50 | 10 | 30 | 110 | 10 | 130 |
| (Y) | 10 | 40 | 30 | 10 | 30 | 50 | 50 | 70 | 60 | 20 | 10 | 100 |

TABLE 5-continued

| Condition 1 region: | 250 mm × 200 mm |
|---|---|
| starting point: | 40 mm outside center of short edge |
| end point: | " |
| number of target points: | 11 points within region |
| distance/time conversion: | (conversion formula = 0.043 + (0.055 × transport distance/40)) | transport amount of main axis

|  | sa | ab | bc | cd | de | ef | fg | gh | hi | ij | jk | ks |
|---|---|---|---|---|---|---|---|---|---|---|---|---|
| case 1 | 80 | 20 | 120 | 20 | 30 | 20 | 60 | 20 | 80 | 60 | 60 | 90 |
| case 2 | 100 | 40 | 50 | 40 | 20 | 50 | 30 | 70 | 80 | 10 | 70 | 90 |
| case 3 | 80 | 100 | 50 | 70 | 70 | 110 | 40 | 80 | 70 | 50 | 40 | 70 |
| case 4 | 60 | 40 | 40 | 20 | 50 | 70 | 40 | 60 | 20 | 40 | 140 | 90 |
| case 5 | 50 | 20 | 40 | 110 | 40 | 90 | 70 | 30 | 170 | 40 | 40 | 90 |
| case 6 | 60 | 50 | 30 | 130 | 40 | 50 | 90 | 30 | 40 | 80 | 10 | 180 |
| case 7 | 80 | 40 | 70 | 20 | 40 | 30 | 10 | 100 | 20 | 90 | 70 | 100 |
| case 8 | 60 | 50 | 20 | 100 | 30 | 60 | 80 | 20 | 130 | 40 | 50 | 80 |
| case 9 | 150 | 40 | 10 | 20 | 30 | 60 | 80 | 50 | 60 | 90 | 130 | 60 |
| case 10 | 60 | 40 | 60 | 20 | 40 | 50 | 50 | 70 | 60 | 110 | 10 | 130 | transport time (sec)

|  | sa | ab | bc | cd | de | ef | fg | gh | hi | ij | jk | ks | averaged value |
|---|---|---|---|---|---|---|---|---|---|---|---|---|---|
| case 1 | 0.15 | 0.07 | 021 | 0.07 | 0.08 | 0.07 | 0.13 | 0.07 | 0.15 | 0.13 | 0.13 | 0.17 | 0.119 |
| case 2 | 0.18 | 0.10 | 0.11 | 0.10 | 0.07 | 0.11 | 0.08 | 0.14 | 0.15 | 0.06 | 0.14 | 0.17 | 0.117 |
| case 3 | 0.15 | 0.18 | 0.11 | 0.14 | 0.14 | 0.19 | 0.10 | 0.15 | 0.14 | 0.11 | 0.10 | 0.14 | 0.138 |
| case 4 | 0.13 | 0.10 | 0.10 | 0.07 | 0.11 | 0.14 | 0.10 | 0.13 | 0.07 | 0.10 | 0.24 | 0.17 | 0.12 |
| case 5 | 0.11 | 0.07 | 0.10 | 0.19 | 0.10 | 0.17 | 0.14 | 0.08 | 0.28 | 0.10 | 0.10 | 0.17 | 0.134 |
| case 6 | 0.13 | 0.11 | 0.08 | 0.22 | 0.10 | 0.11 | 0.17 | 0.08 | 0.10 | 0.15 | 0.06 | 0.29 | 0.134 |
| case 7 | 0.15 | 0.10 | 0.14 | 0.07 | 0.10 | 0.08 | 0.06 | 0.18 | 0.07 | 0.17 | 0.14 | 0.18 | 0.12 |
| case 8 | 0.13 | 0.11 | 0.07 | 0.18 | 0.08 | 0.13 | 0.15 | 0.07 | 0.22 | 0.10 | 0.11 | 0.15 | 0.126 |
| case 9 | 0.25 | 0.10 | 0.06 | 0.07 | 0.08 | 0.13 | 0.15 | 0.11 | 0.13 | 0.17 | 0.22 | 0.13 | 0.132 |
| case 10 | 0.13 | 0.10 | 0.13 | 0.07 | 0.10 | 0.11 | 0.11 | 0.14 | 0.13 | 0.19 | 0.06 | 0.22 | 0.123 | total averaged value of 0.126SEC

In the table 5, considering a case 1, an X component and a Y component of an interval between one point and another point preceding to the first-mentioned point are given as follows: sa: X=80, Y=50, ab: X=10, Y=20, bc: X=120, Y=30, cd: X=20, Y=10, de: X=10, Y=30, ef: X=20, Y=0, fg: X=10, Y=60, gh: X=20, Y=10, hi: X=80, Y=80, ij: X=60, Y=30, jk: X=60, Y=60, ks: X=90, Y=0. A transport amount of a main axis as to a layer interval within the intervals among the respective points is given as follows: sa: 80, ab: 20, bc: 120, cd: 20, de: 30, ef: 20, fg: 60, gh: 20, hi: 80, ij: 60, jk: 60, ks: 90 (mm).

When a calculation is made of transport times among the respective points by using these values based on the conversion formula, the following transport times are given as follows: sa: 0.15, ab: 0.07, bc: 0.21, cd: 0.07, de; 0.08, ef: 0.07, fg: 0.13, gh: 0.07, hi: 0.15, ij: 0.13, jk: 0.13, ks: 0.17 (seconds). An averaged value of these transport times becomes 0.119 seconds.

Similarly, when averaged values of the respective transport times from the case 2 to the case 10 are calculated, the following values are given: case 2: 0.117, case 3: 0.138, case 4: 0.12, case 5: 0.134, case 6: 0.134, case 7: 0.12, case 8: 0.126, case 9: 0.132, case 10: 0.123 (seconds). Furthermore, when an averaged value of the summed transport times is calculated, it becomes 0.126 seconds.

As a consequence, since this averaged value becomes longer than the above-described region-M target transport time of 0.1 second, it can be seen that the plane section defined by 250 mm×200 mm could not be employed.

The table 6 indicates such a case that the plane section is defined by 125 mm×200 mm.

TABLE 6

| Condition 1 region: | 250 mm × 200 mm |
|---|---|
| starting point: | 40 mm outside center of short edge |
| end point: | " |
| number of target points: | 11 points within region |
| distance/time conversion: | (conversion formula = 0.043 + (0.055 × transport distance/40)) | transport amount (X:axis of 125 · Y:axis of 200)

|  |  | sa | ab | bc | cd | de | ef | fg | gh | hi | ij | jk | ks |
|---|---|---|---|---|---|---|---|---|---|---|---|---|---|
| case 1 | (X) | 60 | 5 | 60 | 10 | 5 | 10 | 5 | 10 | 40 | 30 | 30 | 65 |
|  | (Y) | 50 | 20 | 30 | 10 | 30 | 0 | 60 | 10 | 80 | 30 | 60 | 50 |
| case 2 | (X) | 70 | 20 | 20 | 5 | 5 | 25 | 0 | 5 | 35 | 5 | 35 | 65 |

TABLE 6-continued

| | | | | | | | | | | | | |
|---|---|---|---|---|---|---|---|---|---|---|---|---|
| Condition 1 region: | | | | | 250 mm × 200 mm | | | | | | | |
| starting point: | | | | | 40 mm outside center of short edge | | | | | | | |
| end point: | | | | | " | | | | | | | |
| number of target points: | | | | | 11 points within region | | | | | | | |
| distance/time conversion: | | | | | (conversion formula = 0.043 + (0.055 × transport distance/40)) | | | | | | | |

| | | | | | | | | | | | | |
|---|---|---|---|---|---|---|---|---|---|---|---|---|
| | (Y) | 50 | 30 | 50 | 40 | 20 | 40 | 30 | 70 | 80 | 10 | 20 | 50 |
| case 3 | (X) | 55 | 50 | 25 | 35 | 20 | 20 | 20 | 40 | 5 | 25 | 20 | 55 |
| | (Y) | 80 | 30 | 20 | 10 | 70 | 110 | 40 | 30 | 70 | 40 | 20 | 80 |
| case 4 | (X) | 50 | 20 | 20 | 10 | 25 | 35 | 15 | 5 | 0 | 20 | 70 | 55 |
| | (Y) | 10 | 20 | 40 | 20 | 20 | 0 | 40 | 60 | 20 | 0 | 40 | 10 |
| case 5 | (X) | 45 | 10 | 20 | 55 | 20 | 45 | 0 | 5 | 85 | 20 | 5 | 55 |
| | (Y) | 30 | 0 | 30 | 50 | 40 | 30 | 70 | 30 | 50 | 10 | 40 | 30 |
| case 6 | (X) | 50 | 0 | 15 | 65 | 5 | 25 | 45 | 15 | 20 | 10 | 5 | 110 |
| | (Y) | 30 | 50 | 10 | 20 | 40 | 10 | 20 | 20 | 30 | 80 | 10 | 30 |
| case 7 | (X) | 60 | 20 | 35 | 0 | 10 | 5 | 5 | 50 | 10 | 45 | 35 | 70 |
| | (Y) | 60 | 20 | 10 | 20 | 40 | 30 | 0 | 30 | 10 | 40 | 40 | 60 |
| case 8 | (X) | 50 | 25 | 0 | 50 | 15 | 30 | 10 | 5 | 65 | 20 | 20 | 50 |
| | (Y) | 0 | 30 | 20 | 40 | 20 | 10 | 80 | 20 | 40 | 20 | 50 | 0 |
| case 9 | (X) | 95 | 20 | 5 | 10 | 5 | 20 | 5 | 10 | 0 | 45 | 65 | 50 |
| | (Y) | 50 | 40 | 0 | 10 | 30 | 60 | 80 | 50 | 60 | 40 | 30 | 50 |
| case 10 | (X) | 50 | 5 | 30 | 10 | 20 | 25 | 25 | 5 | 15 | 55 | 5 | 85 |
| | (Y) | 10 | 40 | 30 | 10 | 30 | 50 | 50 | 70 | 60 | 20 | 10 | 10 | transport amount of main axis

| | sa | ab | bc | cd | de | ef | fg | gh | hi | ij | jk | ks |
|---|---|---|---|---|---|---|---|---|---|---|---|---|
| case 1 | 60 | 20 | 60 | 10 | 30 | 10 | 60 | 10 | 80 | 30 | 60 | 65 |
| case 2 | 70 | 30 | 50 | 40 | 20 | 40 | 30 | 70 | 80 | 10 | 35 | 65 |
| case 3 | 80 | 50 | 25 | 35 | 70 | 110 | 40 | 40 | 70 | 40 | 20 | 80 |
| case 4 | 50 | 20 | 40 | 20 | 25 | 35 | 40 | 60 | 20 | 20 | 70 | 55 |
| case 5 | 45 | 10 | 30 | 55 | 40 | 45 | 70 | 30 | 85 | 20 | 40 | 55 |
| case 6 | 50 | 50 | 15 | 65 | 40 | 25 | 45 | 20 | 30 | 80 | 10 | 110 |
| case 7 | 60 | 20 | 35 | 20 | 40 | 30 | 5 | 50 | 10 | 45 | 40 | 70 |
| case 8 | 50 | 30 | 20 | 50 | 20 | 30 | 80 | 20 | 65 | 20 | 50 | 50 |
| case 9 | 95 | 40 | 5 | 10 | 30 | 60 | 80 | 50 | 60 | 45 | 65 | 50 |
| case 10 | 50 | 40 | 30 | 10 | 30 | 50 | 50 | 70 | 60 | 55 | 10 | 80 | transport time (sec)

| | sa | ab | bc | cd | de | ef | fg | gh | hi | ij | jk | ks | averaged value |
|---|---|---|---|---|---|---|---|---|---|---|---|---|---|
| case 1 | 0.13 | .07 | 0.13 | 0.06 | 0.08 | 0.06 | 0.13 | 0.06 | 0.15 | 0.08 | 0.13 | 0.13 | 0.1 |
| case 2 | 0.14 | 0.08 | 0.11 | 0.10 | 0.07 | 0.10 | 0.08 | 0.14 | 0.15 | 0.06 | 0.09 | 0.13 | 0.105 |
| case 3 | 0.15 | 0.11 | 0.08 | 0.09 | 0.14 | 0.19 | 0.10 | 0.10 | 0.14 | 0.10 | 0.07 | 0.15 | 0.119 |
| case 4 | 0.11 | 0.07 | 0.10 | 0.07 | 0.08 | 0.09 | 0.10 | 0.13 | 0.07 | 0.07 | 0.14 | 0.12 | 0.095 |
| case 5 | 0.10 | 0.06 | 0.08 | 0.12 | 0.10 | 0.10 | 0.14 | 0.08 | 0.16 | 0.07 | 0.10 | 0.12 | 0.103 |
| case 6 | 0.11 | 0.11 | 0.06 | 0.13 | 0.10 | 0.08 | 0.10 | 0.07 | 0.08 | 0.15 | 0.06 | 0.19 | 0.105 |
| case 7 | 0.13 | 0.07 | 0.09 | 0.07 | 0.10 | 0.08 | 0.05 | 0.11 | 0.06 | 0.10 | 0.10 | 0.14 | 0.092 |
| case 8 | 0.11 | 0.08 | 0.07 | 0.11 | 0.07 | 0.08 | 0.15 | 0.07 | 0.13 | 0.07 | 0.11 | 0.11 | 0.099 |
| case 9 | 0.17 | 0.10 | 0.05 | 0.06 | 0.08 | 0.13 | 0.15 | 0.11 | 0.13 | 0.10 | 0.13 | 0.11 | 0.111 |
| case 10 | 011 | 0.10 | 0.08 | 0.06 | 0.08 | 0.11 | 0.11 | 0.14 | 0.13 | 0.12 | 0.06 | 0.16 | 0.105 | total averaged value of 0.103SEC

Considering now the table 6, when an averaged transport times in the plane section defined by 125 mm×200 mm is calculated in a similar manner to the above table 5, it becomes 0.103 seconds.

As a result, although this averaged value becomes slightly longer than the region-M target transport time of 0.1 second, it can be understood that there are some possibilities that this plane section may be employed due to combinations with the transport time in the components supply region S.

The table 7 indicates such a case that the plane section is defined by 125 mm×100 mm.

TABLE 7

| | |
|---|---|
| Condition 3 region: | 250 mm × 200 mm |
| starting point: | 40 mm outside center of short edge |
| end point: | " |
| number of target points: | 11 points within region |
| distance/time conversion: | (conversion formula = 0.043 + (0.055 × transport distance/40)) | transport amount(X:axis of 125 · Y:axis of 100)

| | sa | ab | bc | cd | de | ef | fg | gh | hi | ij | jk | ks |
|---|---|---|---|---|---|---|---|---|---|---|---|---|
| case 1 (X) | 60 | 5 | 60 | 10 | 5 | 10 | 5 | 10 | 40 | 30 | 30 | 65 |
| (Y) | 25 | 10 | 15 | 5 | 15 | 0 | 30 | 5 | 40 | 15 | 30 | 0 |
| case 2 (X) | 70 | 20 | 20 | 5 | 5 | 25 | 0 | 5 | 35 | 5 | 35 | 65 |
| (Y) | 25 | 15 | 25 | 20 | 10 | 20 | 15 | 35 | 40 | 5 | 10 | 10 |
| case 3 (X) | 55 | 50 | 25 | 35 | 20 | 20 | 20 | 40 | 5 | 25 | 20 | 55 |
| (Y) | 40 | 15 | 10 | 5 | 35 | 55 | 20 | 15 | 35 | 20 | 10 | 20 |
| case 4 (X) | 50 | 20 | 20 | 10 | 25 | 35 | 15 | 5 | 0 | 20 | 70 | 55 |
| (Y) | 5 | 10 | 20 | 10 | 10 | 0 | 20 | 30 | 10 | 0 | 20 | 45 |
| case 5 (X) | 45 | 10 | 20 | 55 | 20 | 45 | 0 | 5 | 85 | 20 | 5 | 55 |
| (Y) | 15 | 0 | 15 | 25 | 20 | 15 | 35 | 15 | 25 | 5 | 20 | 45 |
| case 6 (X) | 50 | 0 | 15 | 65 | 5 | 25 | 45 | 15 | 20 | 10 | 5 | 110 |
| (Y) | 15 | 25 | 5 | 10 | 20 | 5 | 10 | 10 | 15 | 40 | 5 | 15 |
| case 7 (X) | 60 | 20 | 35 | 0 | 10 | 5 | 5 | 50 | 10 | 45 | 35 | 70 |
| (Y) | 30 | 10 | 5 | 10 | 20 | 15 | 0 | 15 | 5 | 20 | 20 | 25 |
| case 8 (X) | 50 | 25 | 0 | 50 | 15 | 30 | 10 | 5 | 65 | 20 | 20 | 50 |
| (Y) | 0 | 15 | 10 | 20 | 10 | 5 | 40 | 10 | 20 | 10 | 25 | 40 |
| case 9 (X) | 95 | 20 | 5 | 10 | 5 | 20 | 5 | 10 | 0 | 45 | 65 | 50 |
| (Y) | 25 | 20 | 0 | 5 | 15 | 30 | 40 | 25 | 30 | 20 | 15 | 15 |
| case 10 (X) | 50 | 5 | 30 | 10 | 20 | 25 | 25 | 5 | 15 | 55 | 5 | 85 |
| (Y) | 5 | 20 | 15 | 5 | 15 | 25 | 25 | 35 | 30 | 10 | 5 | 60 | transport amount of main axis

| | sa | ab | bc | cd | de | ef | fg | gh | hi | ij | jk | ks |
|---|---|---|---|---|---|---|---|---|---|---|---|---|
| case 1 | 60 | 10 | 60 | 10 | 15 | 10 | 30 | 10 | 40 | 30 | 30 | 65 |
| case 2 | 70 | 20 | 25 | 20 | 10 | 25 | 15 | 35 | 40 | 5 | 35 | 65 |
| case 3 | 55 | 50 | 25 | 35 | 35 | 55 | 20 | 40 | 35 | 25 | 20 | 55 |
| case 4 | 50 | 20 | 20 | 10 | 25 | 35 | 20 | 30 | 10 | 20 | 70 | 55 |
| case 5 | 45 | 10 | 20 | 55 | 20 | 45 | 35 | 15 | 85 | 20 | 20 | 55 |
| case 6 | 50 | 25 | 15 | 65 | 20 | 25 | 45 | 15 | 20 | 40 | 5 | 110 |
| case 7 | 60 | 20 | 35 | 10 | 20 | 15 | 5 | 50 | 10 | 45 | 35 | 70 |
| case 8 | 50 | 25 | 10 | 50 | 15 | 30 | 40 | 10 | 65 | 20 | 25 | 50 |
| case 9 | 95 | 20 | 5 | 10 | 15 | 30 | 40 | 25 | 30 | 45 | 65 | 50 |
| case 10 | 50 | 20 | 35 | 10 | 20 | 25 | 25 | 35 | 30 | 55 | 5 | 85 | transport time (sec)

| | sa | ab | bc | cd | de | et | fg | gh | hi | ij | #jk | ks | averaged value |
|---|---|---|---|---|---|---|---|---|---|---|---|---|---|
| case 1 | 0.13 | 0.06 | 0.13 | 0.06 | 0.06 | 0.06 | 0.08 | 0.06 | 0.10 | 0.08 | 0.08 | 0.13 | 0.085 |
| case 2 | 0.14 | 0.07 | 0.08 | 0.07 | 0.06 | 0.08 | 0.06 | 0.09 | 0.10 | 0.05 | 0.09 | 0.13 | 0.085 |
| case 3 | 0.12 | 0.11 | 0.08 | 0.09 | 0.09 | 0.12 | 0.07 | 0.10 | 0.09 | 0.08 | 0.07 | 0.12 | 0.095 |
| case 4 | 0.11 | 0.07 | 0.07 | 0.06 | 0.08 | 0.09 | 0.07 | 0.08 | 0.06 | 0.07 | 0.14 | 0.12 | 0.085 |
| case 5 | 0.10 | 0.06 | 0.07 | 0.12 | 0.07 | 0.10 | 0.09 | 0.06 | 0.16 | 0.07 | 0.07 | 0.12 | 0.092 |
| case 6 | 0.11 | 0.08 | 0.06 | 0.13 | 0.07 | 0.08 | 0.10 | 0.06 | 0.07 | 0.10 | 0.05 | 0.19 | 0.093 |
| case 7 | 0.13 | 0.07 | 0.09 | 0.06 | 0.07 | 0.06 | 0.05 | 0.11 | 0.06 | 0.10 | 0.09 | 0.14 | 0.086 |
| case 8 | 0.11 | 0.08 | 0.06 | 0.11 | 0.06 | 0.08 | 0.10 | 0.06 | 0.13 | 0.07 | 0.08 | 0.11 | 0.088 |
| case 9 | 0.17 | 0.07 | 0.05 | 0.06 | 0.06 | 0.08 | 0.10 | 0.08 | 0.08 | 0.10 | 0.13 | 0.11 | 0.092 |
| case 10 | 0.11 | 0.07 | 0.08 | 0.06 | 0.07 | 0.08 | 0.08 | 0.09 | 0.08 | 0.12 | 0.05 | 0.16 | 0.088 | total averaged value of 0.089SEC

Considering now the table 7, when an averaged transport times in the plane section defined by 125 mm×100 mm is calculated in a similar manner to the above table 5, it becomes 0.089 seconds.

Accordingly, since this calculated averaged time is shorter than the region-M target transport time of 0.1 second, it can be seen that this plane section defined by 125 mm×100 mm can be employed.

When the above-described calculation results are combined, a table 8 is obtained.

TABLE 8

| components absorbing region S | | components mounting region M | |
|---|---|---|---|
| range (mm) | transport time (sec) | range (mm) | transport time (sec) |
| 800 | 0.140 | 250 × 200 | 0.126 |
| 600 | 0.116 | 125 × 200 | 0.103 |
| 400 | 0.092 | 125 × 100 | 0.089 |
| 200 | 0.067 | | |

Considering now the table 8, when a combined case is selected in which a total time of the transport time required for the transport distance within a straight line and the transport time required for the plane section becomes shorter than, or equal to the X-Y target transport time of 0.2 seconds, the following combinations are given as follows:

That is, to say, in a combination case where the transport distance within a straight line is 200 mm and the plane section is defined by 125 mm×100 mm, the summed averaged transport time becomes 0.156 seconds. In a combination case where the transport distance within a straight line is 200 mm and the plane section is defined by 125 mm×200 mm, the summed averaged transport time becomes 0.17 seconds.

In a combination case where the transport distance within a straight line is 200 mm and the plane section is defined by 250 mm×200 mm, the summed averaged transport time becomes 0.193 seconds. In a combination case where the transport distance within a straight line is 400 mm and the plane section is defined by 125 mm×100 mm, the summed averaged transport time becomes 0.181 seconds.

Also, in such a combination case where the transport distance within a straight line is 400 mm and the plane section is defined by 125 mm×200 mm, the summed averaged transport time becomes 0.195 seconds. In any one of these combination cases, the summed averaged transport times can satisfy the X-Y target transport time of 0.2 seconds.

Also, in such a combination case that the transport distance within a straight line is 600 mm and the plane section is defined by 125 mm×100 mm, a summed X-Y transport time becomes 0.205 seconds, and is not equal to the above-described X-Y target transport time of 0.2 seconds. However, since this summed X-Y transport time is substantially equal to the X-Y target transport time, if the target transport time is set to be lower than 0.2 seconds, then this combination case may be employed.

It should be noted that although the above-described embodiment has explained that the starting point is coincident with the end point when the X-Y transport time is calculated within the plane section, there are very few cases where the starting point is not actually coincident with the end point. In the latter case, it is predictable that the X-Y transport time becomes shorter than that of the above explained embodiment. In other words, it is conceivable that the distance defined by adding the distance between the components supplying apparatus 14 of the finally absorbed chip component 13 and a predetermined mounting place where the chip component is firstly mounted to the distance between a predetermined mounting place where the chip component is finally mounted and the components supplying apparatus 14 of the chip component 13 which will be subsequently absorbed, is shorter than the distance defined in such a case that the starting point is coincident with the end point.

As a consequence, according to the components mounting method of the present invention, while the tool head 7 is transported within the components supplying region S, a large number of chip components 13, - - -, 13 are absorbed, and this tool head 7 is moved to the components mounting region X in which the chip components 13, - - -, 13 are mounted on a predetermined mounting place. Therefore, the transportation of the tool head 7 between the components supplying region S and the components mounting region M can be suppressed in a minimum value when the chip components 13, - - -, 13 are mounted on the board 9. As a result, the transport time per single chip component 13, namely the mounting speed (mounting tact time) can be shortened.

Also, as explained in the above embodiment, the components supplying region S and the components mounting region M are properly subdivided, and then the chip components 13, - - -, 13 are absorbed/mounted between the subdivided supplying region S and the subdivided mounting region M. As a consequence, the sequential operations about the absorption and mounting of the chip components 13, - - -, 13 can be optimized by considering the quantity of absorbing nozzles 8, - - -, 8 mounted on the tool head 7, the dimension of the board 9, and the sort/quantity of chip components 13, - - -, 13 to be mounted.

SECOND COMPONENTS MOUNTING METHOD

Figure 16:
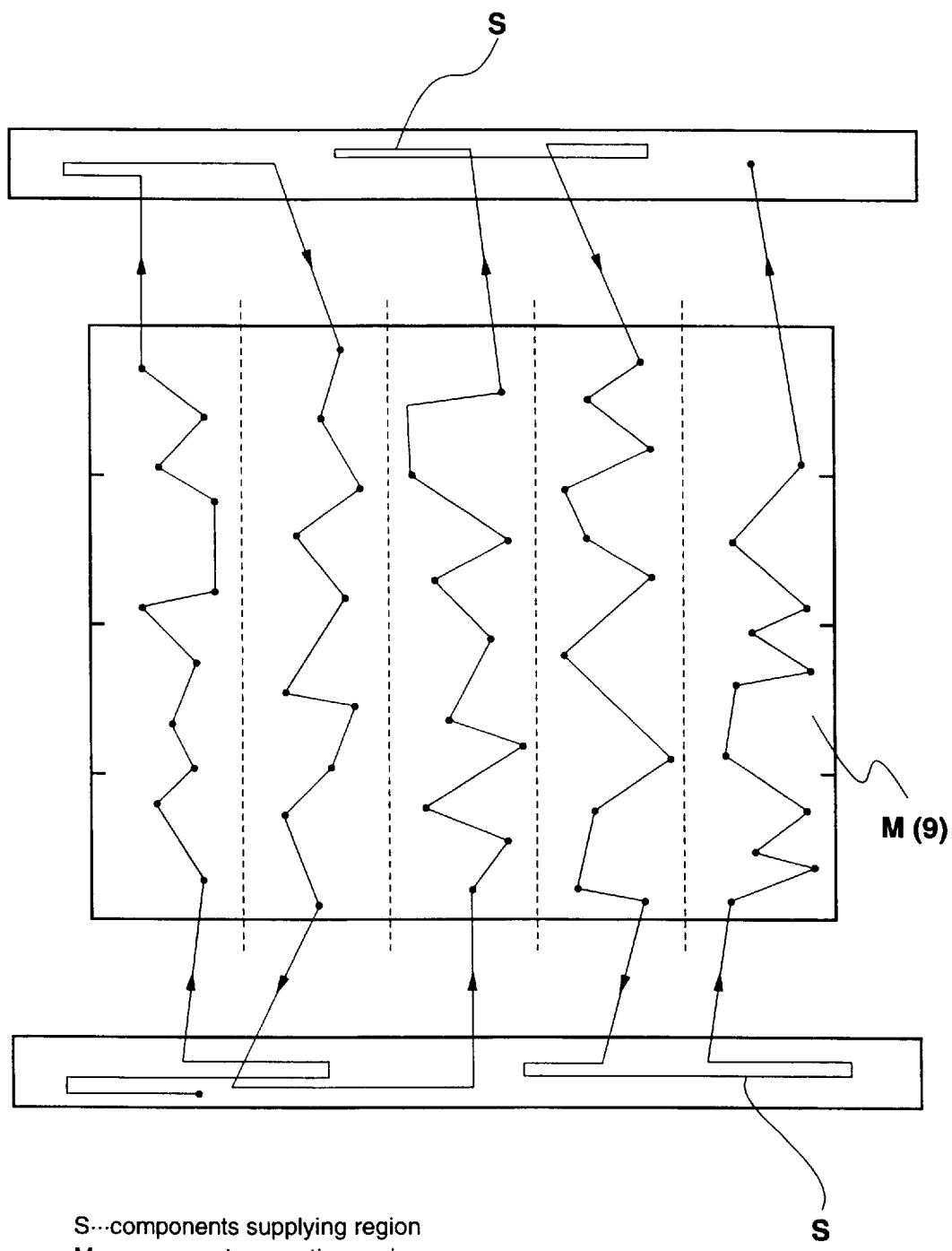
FIG. 16 is a conceptional diagram for describing a components mounting method according to a second embodiment of the present invention.

FIG. 16 schematically represents a components mounting method according to a second embodiment of the present invention. In this second embodiment, such a components mounting apparatus 1 that two components supplying regions "S" and "S" are located on both sides of a components mounting region "M". This components mounting region M is subdivided along the X direction, and also chip components 13, - - - 13 are absorbed in one components supplying region S. Thereafter, the chip components 13, - - - 13 are mounted in the subdivided components mounting region M, and then the tool head 7 is transferred to the other components supplying region S in order to absorb the chip components 13, - - -, 13.

Under such a circumstance, the sequential operations for absorbing and mounting the chip components can be optimized, namely the mounting tact time can be shortened by employing the following manners. That is, a place where the chip component 13 is firstly mounted within the subdivided components mounting region M is set to such a position located closest to one components supply region S. A position where the chip component 13 is finally mounted among this components mounting region M is set to such a position located closest to the other components supplying region S.

It should also be noted that although the components gripping means is operated by the negative pressure absorption in the above-described components mounting apparatus according to the embodiment of the present invention, the present invention is not limited thereto, but may be applied to, for instance, such a components gripping means that electronic components are gripped by means of a clamp and the like.

It should also be noted that the components mounting methods according to the respective embodiments, and also the concrete shapes/structures of the components mounting apparatuses according to the respective embodiments are only exemplified examples. Therefore, these exemplified examples never restrict the technical scope and spirit of the present invention.

What is claimed is:

1. A components mounting method for transporting a plurality of electronic components, which are stored in a plurality of components supplying apparatuses, from a components supplying region to a components mounting region and for mounting said plurality of electronic components onto said board at predetermined mounting positions, the method comprising the steps of:

subdividing at least one of said components supplying region and said components mounting region into at least two subdivided sections; and mounting said electronic components in said components mounting region by:

gripping said electronic components individually using a plurality of said gripping means from a first subdivided section of said components supplying region;

mounting said electronic components from said first subdivided section of said components supplying region into said components mounting region;

gripping said electronic components individually using a plurality of said gripping means from a second subdivided section of said components supplying region; and mounting said electronic components from said second subdivided section of said components supplying region into said components mounting region.

2. A components mounting method as claimed in claim 1, further comprising the step of locating one of said predetermined mounting positions at a location closest to a components supplying apparatus, among said plurality of components supplying apparatuses in said subdivided sections of said components supplying region, at which a previous gripping of said electronic components has been performed by said components gripping means.

3. A components mounting method as claimed in claim 1, wherein further comprising the steps of:

locating one of said predetermined mounting positions at a location closest to a components supplying apparatus, among said plurality of components supplying apparatuses, at which a next gripping of said electronic components is to be performed in said components supplying region to which said components gripping means are to be subsequently transported; and designating said one of said predetermined mounting positions as a final predetermined mounting position in said components mounting region.

4. A components mounting method as claimed in claim 2, further comprising the steps of:

locating one of said predetermined mounting positions at a location closest to a components supplying apparatus, among said plurality of components supplying apparatuses, at which a next gripping of said electronic components is to be performed in said components supplying region to which said components gripping means are to be subsequently transported; and designating said one of said predetermined mounting positions as a final predetermined mounting position in said components mounting region.

5. A components mounting method for transporting a plurality of electronic components, which are stored in a plurality of components supplying apparatuses, from a components supplying region to a components mounting region and for mounting said plurality of electronic components onto said board at predetermined mounting positions, the method comprising the steps of:

subdividing at least one of said components supplying region and said components mounting region into at least two subdivided sections; and mounting said electronic components in said components mounting region by:

gripping said electronic components individually using a plurality of said gripping means in said components supplying region;

mounting said electronic components from said components supplying region into a first subdivided section of said components mounting region;

gripping said electronics components individually using a plurality of said gripping means in said components supplying region again; and mounting said electronic components from said components supplying region into a second subdivided section of said components mounting region.

6. A components mounting method as claimed in claim 5, wherein one of said predetermined mounting positions is at a location closest to a components supplying apparatus, among said plurality of components supplying apparatuses of said components supplying region, at which a previous gripping of said electronics components has been performed by said components gripping means.

7. A components mounting method for transporting a plurality of electronic components, which are stored in a plurality of components supplying apparatuses, from a components supplying region to a components mounting region and for mounting said plurality of electronic components onto said board at predetermined mounting positions, the method comprising the steps of:

subdividing at least one of said components supplying region and said components mounting region into at least two subdivided sections; and mounting said electronic components in said components mounting region by:

gripping said electronic components individually using a plurality of said gripping means in a first subdivided section of said components supplying region;

mounting said electronic components from said first subdivided section of said components supplying region into a first subdivided section of said components mounting region;

gripping said electronics components individually using a plurality of said gripping means in a second subdivided section of said components supplying region; and mounting said electronic components from said second subdivided section of said components supplying region into a second subdivided section of said components mounting region.

8. A component mounting method as claimed in claim 7, further comprising the step of subdividing said components supplying region into two groups of subdivided sections that are arranged on each side of said components mounting region in a direction identical to a direction along which said subdivided sections of said components mounting region are disposed, and wherein said gripping and mounting steps comprise the steps of:

gripping individually a plurality of said electronic components in one of said subdivided sections of said components supplying region by a plurality of said components gripping means;

transporting said plurality of said components gripping means to one of said subdivided sections of said components mounting region;

mounting each of said electronic components gripped by said plurality of said components gripping means onto a predetermined mounting position;

transporting said plurality of said components gripping means to another of said subdivided sections of said components supplying region;

gripping individually a plurality of said electronic components in said another subdivided sections of said components supplying region by said plurality of said components gripping means;

transporting said plurality of said components gripping means to another of said subdivided sections of said components mounting region;

mounting each of said electronic components gripped by said plurality of said components gripping means onto another predetermined mounting position; and repeating the above steps until said electronic components are mounted over the entire components mounting region.

9. A components mounting method as claimed in claim 8, wherein further comprising the step of locating one of said predetermined mounting positions at a location closest to a components supplying apparatus, among said plurality of components supplying apparatuses in said subdivided sections of said components supplying region, at which a previous gripping of said electronic components has been performed by said components gripping means.

10. A components mounting method as claimed in claim 9, further comprising:

locating one of said predetermined mounting positions at a location closest to a components supplying apparatus, among said plurality of components supplying apparatuses, at which a next gripping of said electronic components is to be performed in said components supplying region to which said components gripping means are to be subsequently transported; and designating said one of said predetermined mounting positions as a final predetermined mounting position in said components mounting region.

11. A components mounting method as claimed in claim 8, further comprising the steps of:

locating one of said predetermined mounting positions at a location closest to a components supplying apparatus, among said plurality of components supplying apparatuses, at which a next gripping of said electronic components is to be performed in said components supplying region to which said components gripping means are to be subsequently transported; and designating said one of said predetermined mounting positions as a final predetermined mounting position in said components mounting region.

12. A components mounting method as claimed in claim 7, wherein one of said predetermined mounting positions is at a location closest to a components supplying apparatus, among said plurality of components supplying apparatuses in said subdivided sections of said components supplying region, at which a previous gripping of said electronics components has been performed by said components gripping means.

* * * * *